US012730946B2

(12) United States Patent
Dixit et al.

(10) Patent No.: US 12,730,946 B2
(45) Date of Patent: Sep. 8, 2026

(54) VERIFICATION FOR IMPROVING QUALITY OF MAINTENANCE OF MANUFACTURING EQUIPMENT

(71) Applicant: Applied Materials, Inc., Santa Clara, CA (US)

(72) Inventors: Tarpan Tushar Dixit, Durango, CO (US); Gyan Prakash, Santa Clara, CA (US); Achyuth Madhav Diwakar, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 743 days.

(21) Appl. No.: 17/500,857

(22) Filed: Oct. 13, 2021

(65) Prior Publication Data

US 2023/0113095 A1 Apr. 13, 2023

(51) Int. Cl.

| | |
|---|---|
| ***G06F 30/27*** | (2020.01) |
| ***G05B 13/04*** | (2006.01) |
| ***G05B 23/02*** | (2006.01) |

(52) U.S. Cl.

CPC ............. *G06F 30/27* (2020.01); *G05B 13/04* (2013.01); *G05B 23/0283* (2013.01); *G05B 23/0294* (2013.01)

(58) Field of Classification Search

None

See application file for complete search history.

(56) References Cited

U.S. PATENT DOCUMENTS

| | | | |
|---|---|---|---|
| 8,005,647 B2 | 8/2011 | Armstrong et al. | |
| 11,387,152 B1 * | 7/2022 | Yamamoto ....... | G05B 19/41875 |
| 12,530,022 B2 * | 1/2026 | Raman ................ | G05B 23/024 |
| 12,654,882 B2 * | 6/2026 | Li ............................ | B64F 5/60 |

(Continued)

FOREIGN PATENT DOCUMENTS

| | | |
|---|---|---|
| EP | 1845553 B1 | 10/2009 |
| JP | 2002289506 A | 10/2002 |

(Continued)

OTHER PUBLICATIONS

A. Cachada et al., "Maintenance 4.0: Intelligent and Predictive Maintenance System Architecture," 2018 IEEE 23rd International Conference on Emerging Technologies and Factory Automation (ETFA), Turin, Italy, 2018, pp. 139-146, doi: 10.1109/ETFA.2018.8502489. (Year: 2018).*

(Continued)

*Primary Examiner* — Jennifer L Norton

(74) *Attorney, Agent, or Firm* — Lowenstein Sandler LLP

(57) ABSTRACT

A system is described including a server and manufacturing equipment, wherein the system is configured to initiate a maintenance process of the manufacturing equipment. The maintenance process includes a number of maintenance stages. The system is further configured to provide, to a user device, an instruction indicating that a first maintenance stage is to be performed. The system is further configured to receive data resulting from performance of the first maintenance stage. The system is further configured to determine that the performance of the first maintenance stage was not satisfactory. The system is further configured to cause the user device to display an indication of a corrective action to perform.

20 Claims, 8 Drawing Sheets

(56) References Cited

U.S. PATENT DOCUMENTS

2001/0017878 A1* 8/2001 Nozoe .................. G06T 7/0004 374/7
2002/0024663 A1* 2/2002 Slodowski ............. C02F 1/441 356/256
2002/0038688 A1* 4/2002 Nakano ............ H01J 37/32165 156/345.12
2002/0055804 A1* 5/2002 Betawar .......... G05B 19/41865 700/121
2003/0019839 A1* 1/2003 Yamamoto ........ H01J 37/32862 216/60
2003/0163217 A1* 8/2003 Nakamoto ......... G05B 23/0272 700/121
2003/0200058 A1* 10/2003 Ogawa ................. G02B 27/017 702/184
2004/0176868 A1* 9/2004 Haga .................... G05B 19/418 700/121
2005/0010319 A1* 1/2005 Patel .................... G05B 13/048 700/121
2005/0143852 A1* 6/2005 Roover .................. G05B 17/02 700/121
2006/0184411 A1* 8/2006 Gross ..................... G06Q 10/06 705/7.12
2007/0255442 A1* 11/2007 Nakamura ........... G05B 23/024 700/108
2009/0018692 A1* 1/2009 Yoneda ............ H01L 21/67769 700/121
2009/0225048 A1* 9/2009 Hosokawa ........ H01L 21/67276 345/173
2014/0195184 A1* 7/2014 Maeda .................. G05B 21/02 702/183
2015/0220136 A1* 8/2015 Yuasa .................. G06F 1/3287 713/324
2015/0294884 A1* 10/2015 Ohta ................ H01L 21/67109 118/697
2016/0103445 A1* 4/2016 Patrick .............. G05B 19/4065 700/121
2017/0029332 A1 2/2017 Ayambem et al.
2017/0229332 A1* 8/2017 Miyama .............. H01L 21/3065
2018/0210423 A1* 7/2018 Yamamoto ........... G05B 19/408
2018/0267523 A1* 9/2018 Sigtermans ........... G06F 11/079
2018/0368297 A1* 12/2018 Koga ..................... G06Q 10/20
2019/0019284 A1* 1/2019 Ueda ...................... G06Q 50/04
2019/0079503 A1* 3/2019 Unterguggenberger ..................... G05B 19/41865
2019/0235485 A1* 8/2019 Piety ................. G05B 23/0283
2020/0251360 A1 8/2020 Liao et al.
2020/0379444 A1* 12/2020 Hu .................... G05B 19/4183
2020/0388545 A1 12/2020 Honda et al.
2021/0066141 A1* 3/2021 Phan ...................... G06N 3/045
2021/0080942 A1* 3/2021 Kono ................ G05B 23/0283
2021/0088999 A1* 3/2021 Main-Reade .......... G05B 11/06
2021/0203157 A1* 7/2021 Visweswariah ....... G06F 18/214
2022/0309354 A1* 9/2022 Yoon ........................ G06N 3/09
2023/0126028 A1* 4/2023 Moyne ..................... G06N 3/08 700/121
2023/0400847 A1* 12/2023 Guo .................. G05B 23/0278
2025/0224707 A1* 7/2025 Mathew ............... G05B 19/188
2025/0298406 A1* 9/2025 Ulkar ..................... G06N 3/044
2026/0016818 A1* 1/2026 Gao ..................... G05B 23/024
2026/0030090 A1* 1/2026 Kumar ................. G05B 23/024
2026/0140498 A1* 5/2026 Raman ................. G05B 23/024

FOREIGN PATENT DOCUMENTS

JP 2018195607 A 12/2018
TW 202136943 A 10/2021
WO 2020055555 A1 3/2020

OTHER PUBLICATIONS

International Search Report and Written Opinion for International Application No. PCT/US2022/046464, mailed Feb. 9, 2023, 8 Pages.

Jang S-W., et al., "A Monitoring Method of Semiconductor Manufacturing Processes Using Internet of Things-Based Big Data Analysis," SAGE Journals, Jul. 21, 2017, vol. 13, No. 7, pp. 1-9, pp. 2.5.7, [Retrieved on Jan. 30, 2023] Retrieved from URL: https://journals.sagepub.com/doi/full/10.1177/1550147717721810.

Schellenberger M., Dr.-Ing., "Predictive Lessons Maintenance: Learned from Semiconductor Manufacturing," MAPEtronica—Conference about industry 4.0, Jan. 12, 2018, pp. 10.13.17, [Retrieved on Jan. 30, 2023] Retrieved from URL: https://docplayer.net/131978946-Predictive-maintenance-lessons-learned-from-semiconductor-manufacturing.html.

* cited by examiner

VERIFICATION FOR IMPROVING QUALITY OF MAINTENANCE OF MANUFACTURING EQUIPMENT

TECHNICAL FIELD

The instant specification relates to maintenance processes of manufacturing equipment. More specifically, it relates to a system and method for verification of one or more maintenance operations for improving quality of maintenance of manufacturing equipment.

BACKGROUND

Processing equipment is used in many types of processing systems. Examples of processing equipment includes etch chambers, deposition chambers, anneal chambers, implant chambers, and the like. Typically, a substrate, such as a semiconductor wafer, is placed in a process chamber and conditions in the process chamber are set and maintained to process the substrate. Some processing operations may utilize equipment not limited to a chamber, such as polishing processes. Processing of substrates (e.g., many wafers, many hours of processing time, etc.) causes wear to components of processing equipment (also referred to as manufacturing equipment). Manufacturing equipment, such as chambers, are often taken offline at pre-determined intervals to conduct preventative maintenance. Maintenance processes may include many maintenance stages and/or operations. When preventative maintenance performance is satisfactory, manufacturing equipment may return to production (e.g., be used to process substrates) as scheduled. If preventative maintenance performance is unsatisfactory, a period of unprofitable, unscheduled downtime may occur.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In one aspect of the disclosure, a system is described including a server and manufacturing equipment, wherein the system is configured to initiate a maintenance process of the manufacturing equipment. The maintenance process includes a number of maintenance stages. The system is further configured to provide, to a user device, an instruction indicating that a first maintenance stage is to be performed. The system is further configured to receive data resulting from performance of the first maintenance stage. The system is further configured to determine that the performance of the first maintenance stage was not satisfactory. The system is further configured to cause the user device to display an indication of a corrective action to perform.

In another aspect of the disclosure, a method includes initiating, by a server, a maintenance process of manufacturing equipment. The maintenance process includes a number of maintenance stages, associated with a number of components of the manufacturing equipment. The method further includes providing to a user device an instruction indicating that a first stage of the maintenance process is to be performed. The method further includes receiving data resulting from performance of the first maintenance stage. The method further includes determining that the performance of the first maintenance stage was not satisfactory. The method further includes causing performance of a corrective action.

In another aspect of the disclosure, a method includes receiving, by a user device, an instruction indicating that a first maintenance stage of a maintenance process is to be performed. The maintenance process includes many maintenance stages. The maintenance process is associated with manufacturing equipment. The method further includes providing, to a server, data resulting from performance of the first maintenance stage. The method further includes receiving, from the server, verification data indicating that the performance of the first maintenance stage was not satisfactory. The method further includes causing performance of a corrective action in view of the verification data.

BRIEF DESCRIPTION OF THE DRAWINGS

The present disclosure is illustrated by way of example, and not by way of limitation in the figures of the accompanying drawings.

DETAILED DESCRIPTION

Figure 1:
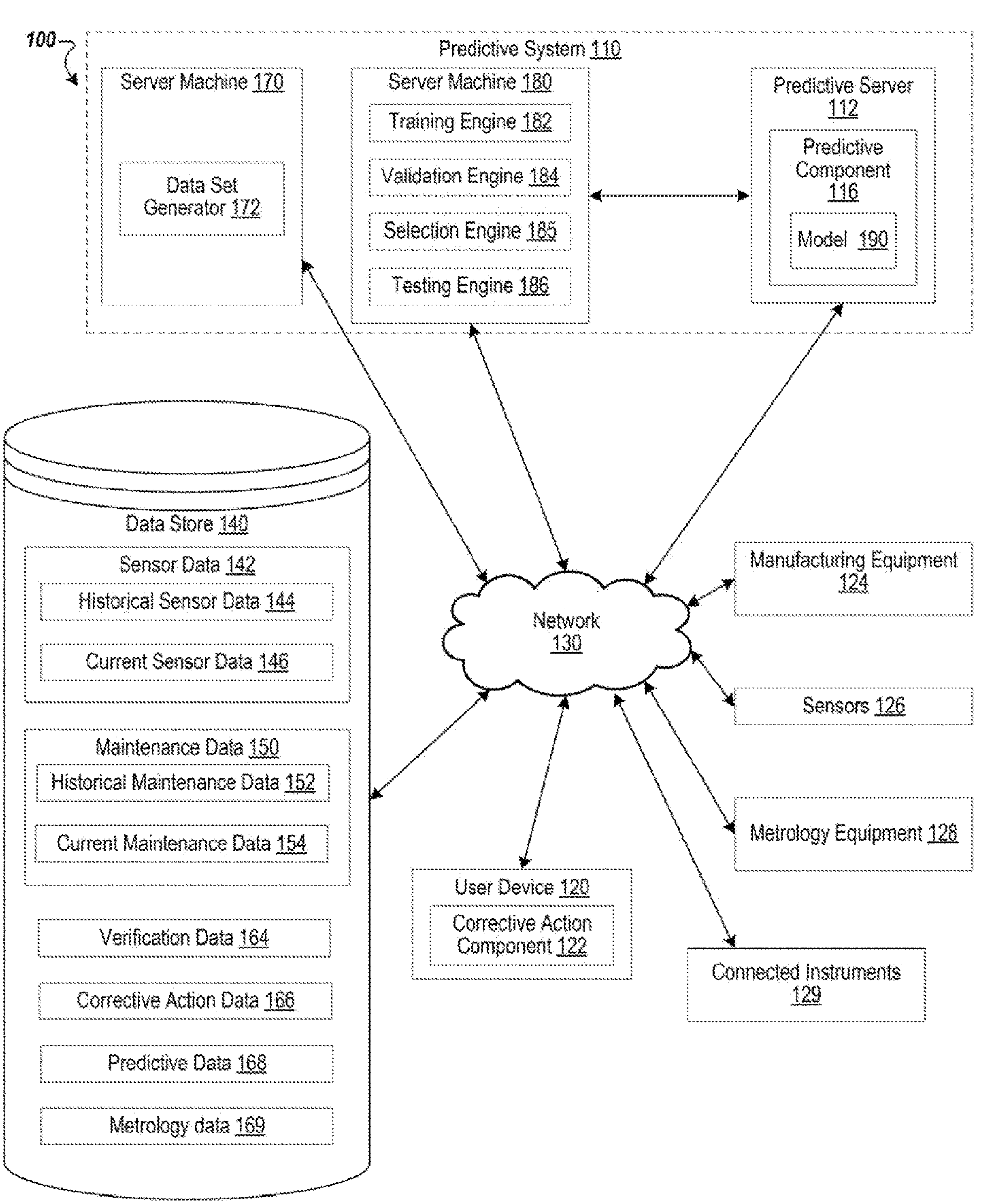
FIG. 1 is a block diagram illustrating an exemplary system (exemplary system architecture), according to some embodiments.

Described herein are technologies directed to a system for initiating and verifying stages of a maintenance process associated with manufacturing equipment. Manufacturing equipment is used to process substrates, such as semiconductor wafers. The properties of these substrates are controlled by the conditions under which the substrates were processed. Various components of the manufacturing equipment contribute to consistent processing of substrates. Substrate processing (e.g., processing of a number of substrates, time spent processing substrates, etc.) results in wear on components of the manufacturing equipment. In order to maintain production of consistent substrates, worn components may be periodically maintained. In some embodiments, maintenance may be triggered based on the amount of time the manufacturing equipment has been used to process wafers, been in production, or the like, since the last maintenance event. In some embodiments, maintenance may be triggered based on the number of wafers processed, sensor data indicative of equipment performance, metrology data of finished substrates, etc.

In some cases, a maintenance process may be performed quickly, for example if a small number of components are to be maintained, if components to be maintained are easily accessible, etc. In some cases, maintenance processes may be extensive, including many maintenance stages associated with many components of the manufacturing equipment. In such cases, verification that the maintenance process is performed (or a particular stage or stages or the process are performed) satisfactorily may be limited. In one example, the maintenance process may include venting a manufacturing chamber that is used to process substrates under vacuum (which may include running a cleaning procedure, a purge procedure, powering off components such as heater and chillers, etc.), removing and/or performing maintenance on various components (e.g., process kit, chamber liner, lift pins, chucking assembly, valves, actuators, windows, sensors, etc.), and reassembling the chamber. Verification that the maintenance process was satisfactorily performed (e.g., the result of performing maintenance was equipment that meets specifications) may not be performed until after the chamber is reassembled. Sensors may then verify that the chamber pumps back down to vacuum properly, that seasoning of the chamber proceeds properly, that acceptable substrates are produced, etc.

In some cases, after a maintenance event (e.g., after the stages of a maintenance process are completed), manufacturing equipment may not pass a qualification test (e.g., a manufacturing or processing chamber is found to not meet performance metrics). In some cases, after manufacturing equipment fails a qualification test, the equipment enters a period of unscheduled downtime, possibly including troubleshooting, further maintenance, etc., to return the equipment to an operable state (e.g., a state that meets performance metrics). There may be many components that were adjusted, cleaned, replaced, maintained, etc., between beginning a maintenance process and receiving verification that performance of the maintenance process was not satisfactory. It may be difficult to predict which component or components are responsible for the manufacturing equipment not meeting performance metrics, which maintenance stages should be repeated, etc. Maintenance stages may be chosen to repeat, or the entire maintenance process may be repeated to correct any problems introduced during the manufacturing process. Such an approach involves experimentation to return the equipment (e.g., manufacturing chamber) to an operable condition. Experimentation is costly in terms of time expended, material used, labor, etc. Additionally, the manufacturing equipment may again fail a qualification test after an extended maintenance event, further increasing downtime, decreasing productivity, wasting materials, etc. Further compounding the problems, some metrics for qualifying manufacturing equipment (e.g., metrology of substrates produced in a substrate manufacturing chamber) may not be directly indicative of the success of the maintenance process (e.g., a particular substrate may not meet performance metrics despite maintenance being performed correctly), and using such metrics to qualify manufacturing equipment can lead to unnecessary downtown due to a false negative qualification test.

The methods and devices of the current disclosure address at least some of these deficiencies of conventional approaches. This disclosure enables the use of a system providing stage-by-stage verification of success or failure of stages or operations of a maintenance process. In some embodiments, the system of this disclosure includes a server. In some embodiments, the system further includes a user device. In some embodiments, the system further includes sensors associated with manufacturing equipment (e.g., a substrate processing chamber) and connected smart instruments. The system may be configured to provide instruction to a user device indicating that a first maintenance stage of a maintenance process is to be performed. The system may be further configured to provide information indicative of performance of maintenance stages to the server. The system may be further configured to determine if a maintenance stage was performed satisfactorily. The system may be further configured to provide a verification notice to the user device indicating the quality of performance of the maintenance stage.

In some embodiments, verifying that a maintenance stage was performed satisfactorily may include comparing data values received by a processing device to a threshold value (e.g., comparing pressure sensor values to a threshold to ensure a chamber can achieve sufficient vacuum). In some embodiments, verifying that a maintenance stage was performed satisfactorily may include providing data resulting from performance of the maintenance stage to a physics-based model (e.g., comparing operation of a mass flow controller to operation of a digital twin of the mass flow controller). In some embodiments, verifying that a maintenance stage was performed correctly may include providing data resulting from performance of the maintenance stage to a trained machine learning model (e.g., a picture of a component cleaned during the maintenance stage, such as an electrostatic chuck, may be provided for processing to a trained machine learning model, an image may be processed to determine if parts were placed correctly or fasteners used properly, etc.). In some embodiments, a user device may be configured to display information associated with verification of satisfactory performance of a maintenance stage to a user. In some embodiments, the user device may further be configured to display suggested actions to the user in view of the verification data. In some embodiments, the user device may further be configured to collect information (e.g., generate images of manufacturing equipment) usable to determine whether one or more maintenance stages or operations have been performed correctly.

The methods of this disclosure further include, in some embodiments, initiating, by a server, a maintenance process of manufacturing equipment. The method further includes providing instruction to a user device indicating that a first maintenance stage of the maintenance process is to be performed. The method further includes receiving data resulting from a first performance of the first maintenance stage (e.g., at a server computing device or controller). The method further includes determining that the first performance of the first maintenance stage was not satisfactory. The method further includes causing the user device to display an indication of a corrective action to perform.

The methods of this disclosure further include, in some embodiments, receiving, by a user device, instruction indicating that a first maintenance stage of a maintenance process is to be performed. The method further includes providing to a server data resulting from first performance of the first maintenance stage. The method further includes receiving from the server verification data indicating that performance of the first maintenance stage was not satisfactory. The method further includes causing performance of a corrective action in view of the verification data.

Aspects of the present disclosure result in technological advantages over conventional methods. Verification of quality of maintenance after a stage of the maintenance process controls the number of components, number of maintenance operations, etc., that are to be double-checked in case of a failed qualification text or failed verification. Additionally, accumulated knowledge may be stored in the server, and appropriate corrective actions may be provided to a user via the user device. This increases accuracy and efficiency of troubleshooting failed maintenance stages.

FIG. 1 is a block diagram illustrating an exemplary system 100 (exemplary system architecture), according to certain embodiments. The system 100 includes a user device 120, manufacturing equipment 124, sensors 126, metrology equipment 128, connected instruments 129, a predictive server 112, and a data store 140. Predictive server 112 may be part of predictive system 110. Predictive system 110 may further include server machines 170 and 180.

Sensors 126 (e.g., sensors associated with manufacturing equipment 124) may provide sensor data 142 associated with manufacturing equipment 124 (e.g., indicative of conditions associated with manufacturing equipment 124, for instance, during a stage of a maintenance event). Sensor data 142 may also include data recorded by sensors during a time other than a maintenance event, such as during production, during a qualification test, etc. Sensor data 142 may also include data from sensors not associated with manufacturing equipment 124. Connected instruments 129 (also referred to as connected tools) may generate data included in sensor data 142. A connected instrument 129 may be a tool that is connected to user device 120 and/or server machine 170 via a wired or wireless connection. In one embodiment, a connected instrument 129 may include a power source and a wireless module that connects the connected instrument 129 to user device 120 and/or server machine 170 via a wireless connection, such as a Bluetooth connection, a Wi-Fi connection, a Zigbee connection, and so on. For instance, a connected torque wrench may provide information from sensors in the connected torque wrench indicating the torque to which a component was tightened by the connected torque wrench, a connected screwdriver may provide information indicative of how many turns a screw was turned by the connected screwdriver, and the like. User device 120 may also generate data included in sensor data 142. For instance, user device 120 may include a camera usable to generate an image or video data, which may be included in sensor data 142. Sensor data 142 may be used for determination of equipment health and/or product health (e.g., product quality), for example. Manufacturing equipment 124 may produce products following a recipe or performing runs over a period of time. In some embodiments, sensor data 142 may include values of one or more of temperature (e.g., heater temperature), spacing (SP), pressure, High Frequency Radio Frequency (HFRF), voltage of Electrostatic Chuck (ESC), electrical current, flow (e.g., of one or more gases), power, voltage, etc. Sensor data 142 may include historical sensor data 144 and current sensor data 146.

Manufacturing equipment 124 may be configured for a maintenance event according to maintenance data 150. Maintenance data 150 may be associated with or indicative of parameters for maintenance stages such as hardware parameters (e.g., settings or components (e.g., size, type, etc.) of the manufacturing equipment 124) and/or process parameters of the manufacturing equipment (e.g., gas flow, pressure, heater and chiller controller, etc.). Maintenance data 150 may also include instructions for various maintenance stages or operations of a maintenance process. Instructions may include written description, images, video, sound, means to control parameters of manufacturing equipment 124, etc. Maintenance data 150 may include process recipes for performing maintenance stages. Maintenance data may include metrics for assigning a score indicative of the success of a maintenance event, process, stage, operation, etc. Maintenance data 150 may include instructions to be executed in case of a failed verification, qualification, etc. of a maintenance event, process, stage, operation, etc. Instructions may include instructions to be provided to a user (e.g., via user device 120) or instructions to be provided directly to manufacturing equipment 124 to cause manufacturing equipment 124 to be configured according to some parameters for maintenance. Maintenance data 150 may include historical maintenance data 152 and/or current maintenance data 154. Maintenance data 150 may be indicative of input settings to the manufacturing device (e.g., heater power, gas flow, etc.) for some portion of a maintenance process. Sensor data 142 may be provided while maintenance associated with manufacturing equipment 124 is performed (e.g., equipment readings when a maintenance process is being carried out). Sensor data 142 may be different for each maintenance event.

In some embodiments, sensor data 142 may be processed (e.g., by user device 120, by predictive server 112, by server machine 170, etc.). Processing of sensor data 142 may include generating or determining features of the sensor data 142. In some embodiments, the features are a pattern in sensor data 142 (e.g., slope, width, height, peak, etc.) or a combination of values from sensor data 142 (e.g., power derived from voltage and current, etc.). Sensor data 142 may include features and the features may be used by predictive component 116 for performing signal processing and/or for obtaining predictive data 168, possibly for performance of a corrective action. Corrective actions may include providing an alert to a user, providing maintenance instructions to a user (e.g., instructions to perform one or more maintenance operations, instructions to repeat a maintenance operation, etc.), updating a process recipe (e.g., a maintenance process recipe), etc.

Each instance (e.g., set) of sensor data 142 may correspond to a particular maintenance event (e.g., performance of a maintenance process including a number of maintenance stages of manufacturing equipment 124), a type of maintenance (e.g., a particular set of manufacturing equipment 124, a type of chamber, a process including set maintenance stages, etc.), or the like. Maintenance data 150 may include sets with similar properties.

Data store 140 may include metrology data 169, collected using metrology equipment 128, and associated with products processed using manufacturing equipment 124. Metrology data 169 may include sets with similar properties to sensor data 142 and maintenance data 150. Data store 140 may store information associating different sets of data. For example, data may be stored indicating that multiple data sets correspond to the same product (e.g., metrology data 169 representing measurements of the product, sensor data 142 related to a maintenance event involving manufacturing equipment used to process the product, etc.).

User device 120, manufacturing equipment 124, sensors 126, metrology equipment 128, connected instruments 129, predictive server 112, data store 140, server machine 170, and server machine 180 may be coupled to each other via a network 130 for generating predictive data 168, optionally for performing corrective actions.

In some embodiments, network 130 is a public network that provides user device 120 with access to predictive server 112, data store 140, and/or other publicly available computing devices. In some embodiments, network 130 is a private network that provides user device 120 access to manufacturing equipment 124, sensors 126, metrology equipment 128, connected instruments 129, data store 140, and/or other privately available computing devices. Network 130 may include one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

User device 120 may include a computing device such as Personal Computers (PCs), laptops, mobile phones, smart phones, tablet computers, netbook computers, network connected televisions ("smart TV"), network-connected media players (e.g., Blu-ray player), a set-top-box, Over-the-Top (OTT) streaming devices, operator boxes, wearable computing device, augmented/virtual reality device, etc. In some embodiments, user device 120 is a mobile computing device, such as a laptop, mobile phone, smart phone, tablet computer, or netbook computer. User device 120 may collect one or more types of sensor data (e.g., generate images of portions of a process chamber after one or more maintenance operations), and may send the sensor data to predictive server 112 for processing. User device may additionally or alternatively, receive information from server machine 170 and/or predictive server 112 indicating whether a maintenance stage or operation was successful) e.g., that the sensor data associated with the maintenance stage satisfied maintenance criteria) or unsuccessful (e.g., that sensor data associated with the maintenance stage failed to satisfy maintenance criteria).

User device 120 may include a corrective action component 122. Corrective action component 122 may receive user input (e.g., via a Graphical User Interface (GUI) displayed via user device 120, via voice control of user device 120, etc.) related to a maintenance operation of manufacturing equipment 124. In some embodiments, a user utilizes a camera of user device 120 to capture an image of a component associated with a maintenance operation. In some embodiments, the user may provide a description of the maintenance operation, via text entry, voice entry, multiple choice selection, etc. In some embodiments, corrective action component 122 transmits the data related to the maintenance operation to predictive system 110, and receives output (e.g., predictive data 168) from predictive system 110. In some embodiments, corrective action component 122 determines a corrective action based on the output, and causes the corrective action to be implemented. The corrective action may include providing an alert to a user, providing instructions to a device (e.g., user device 120, a device of manufacturing equipment 124, etc.), updating a process recipe (e.g., a maintenance process recipe), etc.

In some embodiments, predictive system 110 may further include a predictive component 116. Predictive component 116 may take data (e.g., sensor data 142) retrieved from data store 140, user device 120, etc. to generate predictive data 168. Predictive data 168 may include predicted indications of performance of equipment, components, etc., in view of sensor data 142 associated with maintenance of the equipment. Predictive data 168 may include indications of success of a maintenance stage, operation, process, etc. In some embodiments, predictive component 116 provides predictive data 168 to user device 120, and user device 120 causes a corrective action via corrective action component 122 in view of predictive data 168. For instance, corrective action component 122 may provide maintenance instructions to a user via user device 120 based on sensor data 142 related to a maintenance operation. In some embodiments, corrective action component 122 obtains sensor data 142 (e.g., current sensor data 146) associated with manufacturing equipment 124 (e.g., from data store 140, etc.) and provides sensor data 142 (e.g., current sensor data 146) associated with the manufacturing equipment 124 to predictive system 110.

In some embodiments, corrective action component 122 stores sensor data 142 in data store 140 and predictive server 112 retrieves sensor data 142 from data store 140. In some embodiments, predictive server 112 may store output of trained machine learning model(s) 190 in data store 140 and user device 120 may retrieve the output from data store 140. In some embodiments, corrective action component 122 receives an indication of a corrective action from predictive system 110 and causes the corrective action to be implemented. Each user device 120 may include an operating system that allows users to one or more of generate, view, or edit data (e.g., indication associated with manufacturing equipment 124, corrective actions associated with manufacturing equipment 124, etc.). User device 120 may further include components for generating image or video data, in some embodiments to be supplied to predictive component 116.

In some embodiments, predictive system 110 may receive data associated with a maintenance operation of a maintenance event. Predictive system 110 may generate verification data 164, indicative of the results of a verification process related to the maintenance operation. Verification data 164 may include a pass/fail indication of the maintenance operation, a grade or score, etc.

In some embodiments, metrology data 169 corresponds to historical property data of products (e.g., produced using manufacturing equipment, maintained according to maintenance data 150 as recorded by sensors as sensor data 142) and predictive data 168 is associated with predicted property data (e.g., of products to be produced or that have been produced by manufacturing equipment 124). In some embodiments, predictive data 168 is or includes predicted metrology data (e.g., virtual metrology data) of the products to be produced or that have been produced using manufacturing equipment 124. In some embodiments, predictive data 168 is or includes an indication of abnormalities (e.g., abnormal products, abnormal components, abnormal manufacturing equipment, abnormal energy usage, etc.) and/or one or more causes of the abnormalities. In some embodiments, predictive data 168 includes an indication of change over time or drift in some component of manufacturing equipment 124, sensors 126, metrology equipment 128, or the like. In some embodiments, predictive data 168 includes an indication of an end of life of a component of manufacturing equipment 124, sensors 126, metrology equipment 128, or the like.

In some embodiments, predictive data 168 includes an indication of whether or not performance of a maintenance stage of a maintenance processes was performed satisfactorily, e.g., whether or not the maintenance process will result in manufacturing equipment 124 passing a qualification test, whether or not products processed using manufacturing equipment 124 after performance of the maintenance process will meet performance standards, etc.

Maintenance events that result in equipment that does not meet performance standards can be costly in time, energy, materials, components, cost of identifying defects and discarded defective products, etc. By using sensor data 142 to generate a prediction of success of a stage or operation of a maintenance process, a maintenance process overall, etc., the cost associated with isolating and correcting an error in a maintenance event may be far reduced. System 100 may provide a technical advantage of avoiding and/or reducing costs associated with troubleshooting associated with a failed maintenance event.

Performing maintenance processes that result in failure of the components of manufacturing equipment 124 can be costly in downtime, damage to products, damage to equipment, express ordering replacement components, etc. By inputting sensor data 142 (e.g., data associated with performance of a maintenance event) into predictive component 116, receiving output of predictive data 168 output by predictive component 116, and taking action based on the output predictive data 168, assessments of maintenance operations may be made before a maintenance process is completed. Such discrete assessments of individual maintenance operations can increase a granularity of information about an execution of a maintenance process, and reduce downtime associated with the maintenance process. The predictive data 168 can also be used for performing corrective actions (e.g., predicted operational maintenance, such as replacement, processing, cleaning, etc. of components) based on the predictive data 168. System 100 can have the technical advantage of avoiding the cost of one or more of unexpected component failure, unscheduled downtime, productivity loss, unexpected equipment failure, product scrap, or the like. Additionally, in embodiments predictive component 116 may compare predictive data sets from the same chamber over time to diagnose drifting or failing components (recorded as predictive data 168). Monitoring the performance over time of components, e.g. manufacturing equipment 124, sensors 126, metrology equipment 128, and the like, may provide indications of degrading components.

Maintenance procedures performed sub-optimally may result in manufacturing equipment produces products that fail to meet performance goals. Such sub-optimal maintenance procedures may have costly results of increased resource (e.g., energy, coolant, gases, etc.) consumption, increased amount of time to produce the products, increased component failure, increased amounts of defective products, etc. By inputting sensor data 142 into predictive component 116 (e.g., which may include trained machine learning model 190), receiving an output of predictive data 168, and performing (e.g., based on predictive data 168) a corrective action based on the predictive data 168, system 100 may perform one or more corrective actions. Corrective actions to be performed by system 100 may include providing an alert to a user, providing maintenance instructions to a user, updating a process recipe, scheduling additional maintenance, etc.

In an example, the corrective action may include updating manufacturing parameters (e.g., setting optimal manufacturing parameters) based on the predictive data 168. By updating the manufacturing parameters according to a state of the manufacturing equipment after maintenance, system 100 can have the technical advantage of using optimal manufacturing parameters (e.g., hardware parameters, process parameters) to avoid costly results of suboptimal manufacturing parameters.

In some embodiments, the corrective action includes providing an alert (e.g., an alarm to stop or not perform one or more additional stages or operations of the maintenance process if predictive data 168 indicates a predicted abnormality, such as an abnormality of the product, a component, or manufacturing equipment 124). In one embodiment, a corrective action includes repeating a previously performed maintenance operation. In one embodiment, a corrective action includes replacing a component of a process chamber. In some embodiments, the corrective action includes providing feedback control (e.g., modifying a manufacturing parameter responsive to predictive data 168 indicating an abnormality). In some embodiments, the corrective action may be performed in view of output of a trained machine learning model. In some embodiments, performance of the corrective action includes causing updates to one or more maintenance parameters.

Corrective actions may include instructions to a user to perform hardware corrections (e.g., replacing components, using certain components, replacing a processing chip, updating firmware, etc.), instructions causing manufacturing equipment to update maintenance parameters (e.g., temperature, pressure, flow, rate, electrical current, voltage, gas flow, lift speed, etc.), updating the settings of one or more connected instruments 129 (e.g., setting torque, etc.), or the like. In some embodiments, the corrective action includes a updating a recipe of a maintenance operation, product processing operation, etc.

Predictive server 112, server machine 170, and server machine 180 may each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

Predictive server 112 may include predictive component 116. Predictive component 116 may be used to produce predictive data 168. In some embodiments, predictive data 168 includes indications of success or failure of maintenance stages of a maintenance process. In some embodiments, predictive data 168 includes indications of components of manufacturing equipment 124 aging, degrading, etc. In some embodiments, predictive component 116 may incorporate sensor data recorded during processing of a product using manufacturing equipment 124 to predict properties of the product.

In some embodiments, predictive component 116 includes one or more model 190 (which may be a trained machine learning model and/or a physics based model such as a digital twin), and sensor data 142 is provided to the trained model(s) 190. In ensuing discussion, a single model will often be mentioned, and a single model is shown in FIG. 1, but it will be understood that model 190 may be many separate models, an ensemble of models, etc. In some embodiments, each stage of maintenance at which verification is determined has its own verification model. Model 190 may be trained to output data indicative of verification of the success of a maintenance stage of a maintenance process (e.g., as verification data 164 or predictive data 168). Model 190 may use one or more of Support Vector Machine (SVM), Radial Basis Function (RBF), clustering, supervised machine learning, semi-supervised machine learning, unsupervised machine learning, k-Nearest Neighbor algorithm (k-NN), linear regression, random forest, neural network (e.g., artificial neural network), etc. In some embodiments, model 190 is configured to accept as input sensor data indicative of performance of a maintenance stage. In some embodiments, this may include sensor data 142 from sensors 126 associated with manufacturing equipment 124, e.g., trace data of one or more pressure sensors as a manufacturing chamber is vented or pumped to vacuum. In some embodiments, model 190 input may include sensor data 142 from sensors associated with user device 120, such as video or image data, e.g. images of a reassembled or cleaned part, to be processed by an image processing machine learning model 190. In some embodiments, sensor data 142 provided to model 190 as input may include sensor data 142 from connected instruments 129, such as smart tools. Model 190 may be trained to provide, in view of the input data, an indication of success or failure of the maintenance stage.

The indication of success or failure may take the form of a pass/fail, a grade, score, or rating, or the like. The score may indicate a likelihood that the performance of the maintenance stage will result in maintenance equipment that satisfies one or more qualification criteria, maintenance equipment to produce products that satisfy one or more performance metrics, etc.

In some embodiments, model 190 may include one or more physics-based models. For example, determination of success or failure of maintenance, installation, etc. of a mass flow controller may include providing sensor data associated with the controller into a physics-based digital twin model. Many of the features discussed above in connection with a machine learning model may apply to physics-based model, e.g., number of models, nature of the input data, source of input data, target output of the physics-based model, etc. In some embodiments, verification data 164 may be generated in view of a comparison between a single sensor value (or multiple sensor values) with a threshold value or values (e.g., finding that at least one sensor value satisfies at least one threshold criterion, finding that at least one sensor value does not satisfy at least one threshold criterion, etc.).

In some embodiments, an action may be performed in view of verification data 164. Generation of an instruction to perform an action may be dependent upon verification data 164 (e.g., pass, fail, grade or score, etc.). In some embodiments, upon determining that a maintenance stage was performed satisfactorily (e.g., verification data indicates the performance passes), instructions may be provided to manufacturing equipment 124 to proceed to the next stage or operation of maintenance, user device 120 may be instructed to display instructions for the next maintenance stage (instructions may be stored as maintenance data 150 in data store 140) to a user, etc. Predictive server 112 may additionally or alternatively provide instructions indicative of a corrective action (e.g., to redo one or more previous maintenance operation).

In some embodiments, an action may be performed in view of verification data 164 indicating that performance of a maintenance stage did not pass verification. Predictive server 112 may provide instruction to manufacturing equipment 124 to repeat a maintenance stage (or parts of a maintenance stage, multiple maintenance stages, etc.), user device 120 may be caused to present instruction to a user regarding troubleshooting, restarting the maintenance stage, etc.

Historical sensor data 144 may be used in combination with current sensor data 146 and manufacturing data 150 to detect drift, changes, aging, etc. of components of manufacturing equipment 124. Predictive component 116 may use combinations and comparisons of these data types to generate predictive data 168. In some embodiments, predictive data 168 includes data predicting the lifetime of components of manufacturing equipment 124, sensors 126, etc. In some embodiments, predictive data 168 may include updates to a maintenance process to reflect changes in the performance of some component or components.

Providing verification of maintenance stages provides technical advantages over other techniques. By ensuring that various stages of a maintenance process meet verification standards, the scope of operations that is examined (e.g., troubleshooting) upon failure may be far reduced, leading to faster green-to-green times (e.g., shorter maintenance events), higher first pass rates (e.g., a higher percentage of maintenance processes that result in manufacturing equipment 124 passing a qualification test), etc. Multiple communication events between user device 120 and a server (e.g., predictive server 112) allows accumulated maintenance knowledge to be provided directly to a user (e.g., a technician) at an appropriate time. This facilitates high quality maintenance work by enabling the capability to deliver detailed instructions do a user both in the case that the maintenance process proceeds smoothly, and the case where it does not. Predictive server 112 may be configured to treat sensor data 142 resulting from different maintenance stages (e.g., different parts of a maintenance process, maintenance of different equipment, etc.) separately. The use of data resulting from each stage may be tuned to generate high-quality verification (e.g., accurate predictions) for that stage (e.g., by providing data to a different model, using a particular subset of sensor data 142, tuning a threshold value to compare to sensor data, etc.). Predictive server 112 and/or model 190 may also be updated over time to produce more powerful predictive data 168, more impactful corrective action data 166, etc.

In some embodiments, predictive component 114 receives current sensor data 146, and may perform pre-processing such as extracting patterns in the data or combining data to new composite data. Predictive component 116 may then provide the data to model 190 as input. Predictive component 116 may receive from model 190 an indication of the success or failure of performance of a maintenance stage of a maintenance process. Predictive component 116 may then generate corrective action data 166 or cause a corrective action to occur responsive to detection of a failed maintenance stage. The corrective action may include sending an alert to user device 120. The corrective action may also include updating maintenance parameters of manufacturing equipment 124. The corrective action may also include generating predictive data 168, indicative of chamber or instrument drift, aging, or failure.

Data store 140 may be a memory (e.g., random access memory), a drive (e.g., a hard drive, a flash drive), a database system, or another type of component or device capable of storing data. Data store 140 may include multiple storage components (e.g., multiple drives or multiple databases) that may span multiple computing devices (e.g., multiple server computers). Data store 140 may store sensor data 142, maintenance data 150, verification data 164, corrective action data 166, predictive data 168, and metrology data 169. Sensor data 142 may include historical sensor data 144 and current sensor data 146. Sensor data may include sensor data time traces over the duration of maintenance processes, associations of data with physical sensors, pre-processed data, such as averages and composite data, and data indicative of sensor performance over time (i.e., many maintenance processes). Metrology data 169 may contain similar features. Maintenance data 150 may include historical maintenance data 152 and current maintenance data 154. Maintenance data may include maintenance process recipes, instruction for equipment, tools, instruments, users, etc. related to maintenance processes, metrics for rating maintenance processes, maintenance stages, etc., or the like. Historical sensor data 144 and historical maintenance data 152 may be historical data (e.g., at least a portion for training the a machine learning model 190 and/or a physics-based model 190). Current sensor data 146 may be current data (e.g., at least a portion to be input into model 190, subsequent to the historical data) for which verification data 164 is to be generated (e.g., for performing corrective actions). Metrology data 169 may be metrology data of produced substrates, as well as sensor data, manufacturing data, and model data corresponding to those products. Metrology data 169 may be leveraged to design processes for making further substrates. Predictive data 168 may include predictions of success or failure of a maintenance stage, process, etc. Predictive data 168 may include predictions of what metrology data may result from a set of input parameters. Predictive data 168 may also include data indicative of components of system 100 aging and failing over time.

In some embodiments, predictive system 110 further includes server machine 170 and server machine 180. Server machine 170 includes a data set generator 172 that is capable of generating data sets (e.g., a set of data inputs and a set of target outputs) to train, validate, and/or test model 190. Some operations of data set generator 172 are described in detail below with respect to FIGS. 2 and 4A. In some embodiments, data set generator 172 may partition historical data (e.g., historical sensor data 144, historical maintenance data 152) and performance data (e.g., metrology data 169, corrective action data 166 of corrective actions associated with historical sensor or maintenance data, etc.) into a training set (e.g., sixty percent of the data), a validating set (e.g., twenty percent of the data), and a testing set (e.g., twenty percent of the data). In some embodiments, predictive system 110 (e.g., via predictive component 116) generates multiple sets of features. For example a first set of features may correspond to a first set of types of sensor data (e.g., from a first set of sensors, first combination of values from first set of sensors, first patterns in the values from the first set of sensors) that correspond to each of the data sets (e.g., training set, validation set, and testing set) and a second set of features may correspond to a second set of types of sensor data (e.g., from a second set of sensors different from the first set of sensors, second combination of values different from the first combination, second patterns different from the first patterns) that correspond to each of the data sets.

Server machine 180 includes a training engine 182, a validation engine 184, selection engine 185, and/or a testing engine 186. An engine (e.g., training engine 182, a validation engine 184, selection engine 185, and a testing engine 186) may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 may be capable of training a model 190 using one or more sets of features associated with the training set from data set generator 172. Training engine 182 may generate multiple trained models 190, where each trained model 190 corresponds to a distinct set of features of the training set (e.g., sensor data from a distinct set of sensors). For example, a first trained model may have been trained using all features (e.g., X1-X5), a second trained model may have been trained using a first subset of the features (e.g., X1, X2, X4), and a third trained model may have been trained using a second subset of the features (e.g., X1, X3, X4, and X5) that may partially overlap the first subset of features. Data set generator 172 may receive the output of a trained model (e.g., 190), collect that data into training, validation, and testing data sets, and use the data sets to train a second model.

Validation engine 184 may be capable of validating a trained model 190 using a corresponding set of features of the validation set from data set generator 172. For example, a first trained model 190 that was trained using a first set of features of the training set may be validated using the first set of features of the validation set. Validation engine 184 may determine an accuracy of each of the trained models 190 based on the corresponding sets of features of the validation set. Validation engine 184 may discard trained models 190 that have an accuracy that does not meet a threshold accuracy. In some embodiments, selection engine 185 may be capable of selecting one or more trained models 190 that have an accuracy that meets a threshold accuracy. In some embodiments, selection engine 185 may be capable of selecting the trained model 190 that has the highest accuracy of the trained models 190.

Testing engine 186 may be capable of testing a trained model 190 using a corresponding set of features of a testing set from data set generator 172. For example, a first trained model 190 that was trained using a first set of features of the training set may be tested using the first set of features of the testing set. Testing engine 186 may determine a trained model 190 that has the highest accuracy of all of the trained models based on the testing sets.

In the case of a machine learning model, the model 190 may refer to the model artifact that is created by the training engine 182 using a training set that includes data inputs and corresponding target outputs (correct answers for respective training inputs). Patterns in the data sets can be found that map the data input to the target output (the correct answer), and the machine learning model 190 is provided mappings that capture these patterns. In the case of a physics-based model, training, validating, selection, and/or testing may also be performed (e.g., to account for inaccuracies of the model, manufacturing tolerances of components of manufacturing equipment 124, varying performance of components, aging of components, etc.). In the case of physics-based models, model 190 may have been created by a user and is refined by the operations of server machine 180.

Predictive component 116 may provide current sensor data 146 to model 190 (e.g., trained machine learning model, physics-based model, etc.) and may run model 190 on the input to obtain one or more outputs. Predictive component 116 may be capable of determining (e.g., extracting) predictive data 168 from the output of model 190 and may determine (e.g., extract) confidence data from the output that indicates a level of confidence that the predictive data 168 is an accurate predictor of a process associated with the input data for maintenance of manufacturing equipment 124, products to be produced using the manufacturing equipment 124 as maintained according to current sensor data 146, indications of lifetime or aging of components, etc. Predictive component 116 or corrective action component 122 may use the confidence data to decide whether to cause a corrective action associated with the manufacturing equipment 124 based on predictive data 168.

The confidence data may include or indicate a level of confidence that predictive data 168 indicates an accurate prediction of future performance, e.g., of manufacturing equipment 124. As an example, predictive data 168 may indicate that a maintenance stage was not performed correctly. The confidence data may indicate that the predictive data 168 is an accurate prediction for rating performance of a maintenance stage associated with at least a portion of the input data. In one example, the level of confidence is a real number between 0 and 1 inclusive, where 0 indicates no confidence that the predictive data 168 is an accurate prediction and 1 indicates absolute confidence that the predictive data 168 accurately predicts results of a maintenance stage. Responsive to the confidence data indicating a level of confidence below a threshold level for a predetermined number of instances (e.g., percentage of instances, frequency of instances, total number of instances, etc.) predictive component 116 may cause the model 190 to be retrained (e.g., based on current sensor data 146, current maintenance data 154, etc.).

For purpose of illustration, rather than limitation, aspects of the disclosure describe the training of one or more models 190 using historical data (e.g., historical sensor data 144, historical maintenance data 152) and inputting current data (e.g., current sensor data 146, current maintenance data 154) into the one or more trained models 190 to determine predictive data 168, verification data 164, corrective action data 166, etc. In other implementations, a heuristic model or rule-based model is used to determine predictive data (e.g., without using a trained machine learning model). Predictive component 116 may monitor historical sensor data 144, historical maintenance data 152, and metrology data 169. Any of the information described with respect to data inputs 210 of FIG. 2 may be monitored or otherwise used in the heuristic or rule-based model.

In some embodiments, the functions of user device 120, predictive server 112, server machine 170, and server machine 180 may be provided by a fewer number of machines. For example, in some embodiments server machines 170 and 180 may be integrated into a single machine, while in some other embodiments, server machine 170, server machine 180, and predictive server 112 may be integrated into a single machine. In some embodiments, user device 120 and predictive server 112 may be integrated into a single machine.

In general, functions described in one embodiment as being performed by user device 120, predictive server 112, server machine 170, and server machine 180 can also be performed on predictive server 112 in other embodiments, if appropriate. In addition, the functionality attributed to a particular component can be performed by different or multiple components operating together. For example, in some embodiments, predictive server 112 may determine the corrective action based on predictive data 168. In another example, user device 120 may determine the predictive data 168 based on output from model 190.

In addition, the functions of a particular component can be performed by different or multiple components operating together. One or more of predictive server 112, server machine 170, or server machine 180 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Embodiments of the disclosure may be applied to data quality evaluation, feature enhancement, model evaluation, Virtual Metrology (VM), Predictive Maintenance (PdM), limit optimization, or the like.

Although embodiments of the disclosure are discussed in terms of generating predictive data 168 to perform a corrective action in manufacturing facilities (e.g., semiconductor manufacturing facilities), embodiments may also be generally applied to improved accuracy of staged processes, where verification may be performed at various stages.

Figure 2:
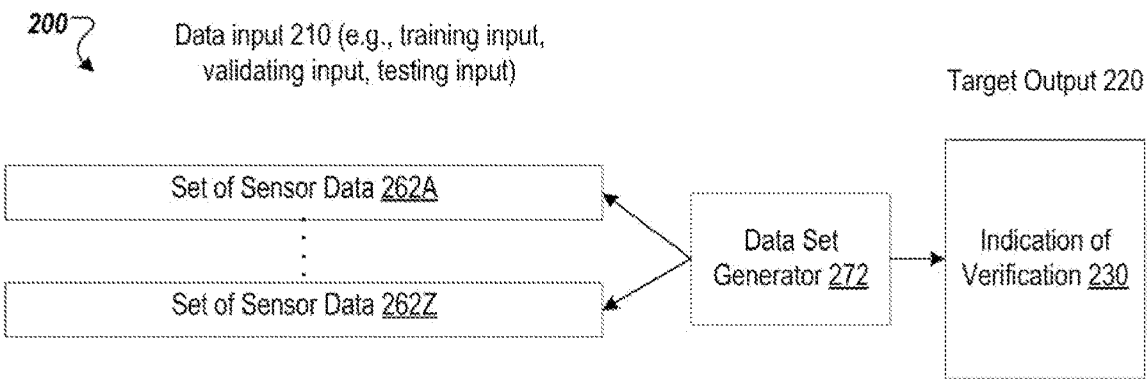
FIG. 2 is a block diagram of an example data set generator used to create data sets for a model, according to some embodiments.

FIG. 2 is a block diagram of an example data set generator 272 (e.g., data set generator 172 of FIG. 1), used to create data sets for a model (e.g., machine learning model 190 of FIG. 1, physics based model 190, etc.), according to certain embodiments. A data set generator 272 may be part of server machine 170 of FIG. 1. In some embodiments, system 100 of FIG. 1 includes multiple models. In such cases, each model may have a separate data set generator, or models may share a data set generator.

Referring to FIG. 2, system 200 containing data set generator 272 (e.g., data set generator 172 of FIG. 1) creates data sets for a model (e.g., model 190 of FIG. 1). Data set generator 272 may create data sets using data retrieved as output from various sensing devices. In some embodiments, data set generator 272 creates training input by choosing a subset of historical data from sensing devices, possibly including sensors associated with manufacturing equipment, sensors associated with a user device, sensors associated with connected instruments, etc. Data set generator 272 may create target output from indications of the success of maintenance stages associated with the sensor data used to create the input data (e.g., verification data 164 of FIG. 1). For example, indication of verification 230 may include a classification of whether or not a maintenance stage associated with sensor data used as input resulted in a successful maintenance process, what troubleshooting or corrective action was successfully taken in response to the input data, etc.

It is within the scope of this disclosure for target output 220 to be represented in a variety of different ways. Indication of verification 230 may include a pass/fail, grade or score, etc. Indication of verification 230 may include an indication of actions to be taken in response to the verification, e.g. instructions to move on to the next stage of maintenance, suggested troubleshooting operations, etc., indications of product properties, indications of effects of maintenance on manufacturing equipment operation, etc.

Referring to FIG. 2, in some embodiments, data set generator 272 generates a data set (e.g., training set, validating set, testing set) that includes one or more data inputs 210 (e.g., training input, validating input, testing input) and may include one or more target outputs 220 that correspond to the data inputs 210. The data set may also include mapping data that maps the data inputs 210 to the target outputs 220. Data inputs 210 may also be referred to as "features," "attributes," or "information." In some embodiments, data set generator 272 may provide the data set to the training engine 182, validating engine 184, or testing engine 186 of FIG. 1, where the data set is used to train, validate, or test model 190 of FIG. 1. Some embodiments of generating a training set may further be described with respect to FIG. 4A.

In some embodiments, data set generator 272 may generate a first data input corresponding to a first set of simulated sensor data 262A to train, validate, or test a first model and the data set generator 272 may generate a second data input corresponding to a second set of simulated sensor data 262B to train, validate, or test a second model.

In some embodiments, data set generator 272 may perform operations on one or more of data input 210 and target output 220. Data set generator 272 may extract patterns from the data (slope, curvature, etc.), may combine data (average, feature production, etc.), or may separate simulated sensors into groups to train separate models.

Data inputs 210 and target outputs 220 to train, validate, or test a model may include information for a particular manufacturing chamber (e.g., a particular semiconductor wafer manufacturing chamber). Data inputs 210 and target outputs 220 may include information for a particular manufacturing chamber design (e.g., used for all chambers of that design).

In some embodiments, the information used to train the model may be from specific types of manufacturing equipment (e.g., manufacturing equipment 124 of FIG. 1) of the manufacturing facility having specific characteristics and allow the trained model to determine outcomes for a specific group of manufacturing equipment 124 based on input for current sensor data (e.g., current sensor data 146) associated with one or more components sharing characteristics of the specific group. In some embodiments, the information used to train the model may be for components from two or more manufacturing facilities and may allow the trained model to determine outcomes for components based on input from one manufacturing facility. In some embodiments, information used to train the model may be specific to a particular maintenance process, maintenance stage, etc.

In some embodiments, subsequent to generating a data set and training, validating, or testing a model using the data set, the model may be further trained, validated, or tested, or adjusted (e.g., based on new sensor data, verification data, metrology data, maintenance data, etc.).

Figure 3:
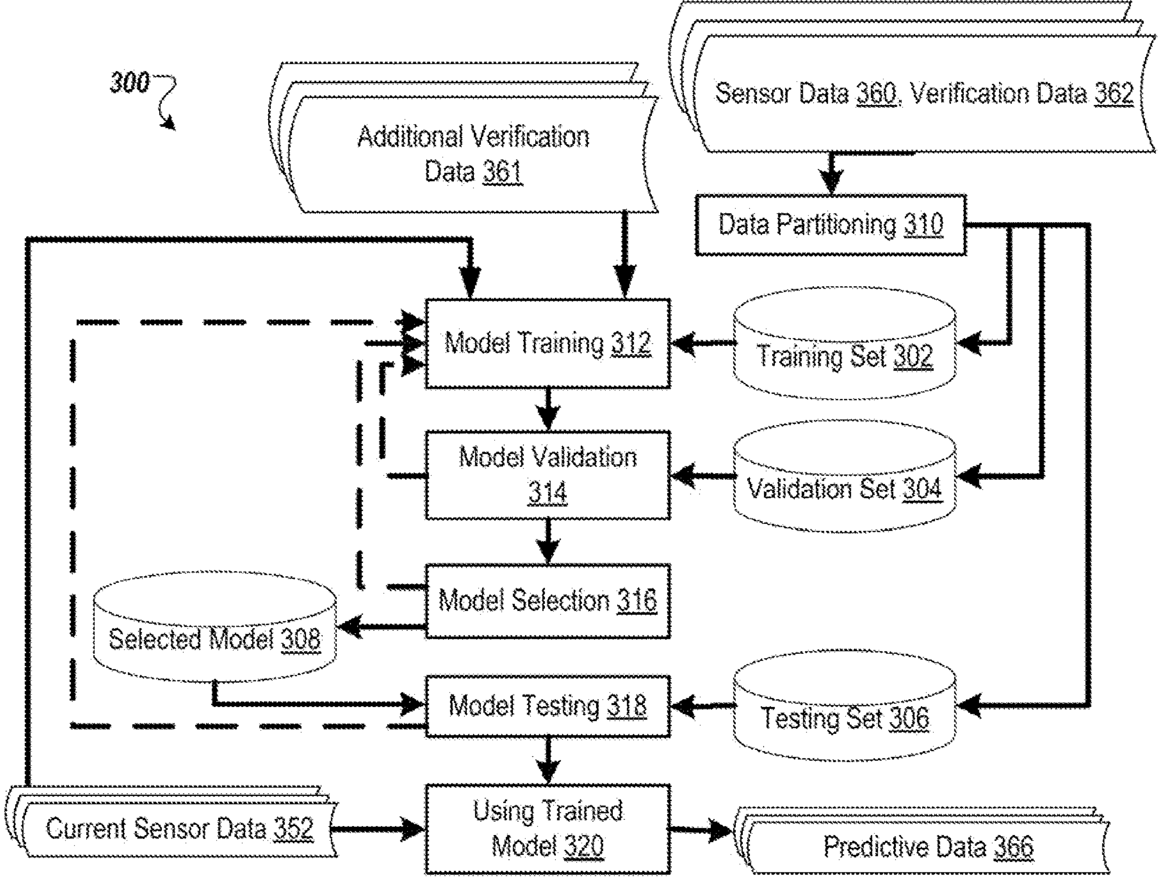
FIG. 3 is a block diagram illustrating a system for generating output data (e.g., predictive data), according to some embodiments.

FIG. 3 is a block diagram illustrating system 300 for generating output data (e.g., predictive data 168 and/or verification data 164 of FIG. 1), according to some embodiments. System 300 may be used to determine predictions of the success of performance of a maintenance stage of a maintenance process preformed in association of manufacturing equipment. System 300 may be used to determine instructions to be carried out in response to performance of a maintenance stage.

Referring to FIG. 3, at block 310, system 300 (e.g., components of predictive system 110 of FIG. 1) performs data partitioning (e.g., via data set generator 172 of server machine 170 of FIG. 1) of sensor data 360 (e.g., extracting features from historical sensor data) and verification data 362 (e.g., indications of verification of historical maintenance, indications of corrective actions associated with historical maintenance) to generate the training set 302, validation set 304, and testing set 306. For example, the training set may be 60% of the sensor and verification data, the validation set may be 20% of the sensor and verification data, and the testing set may be 20% of the sensor and verification data.

At block 312, system 300 performs model training (e.g., via training engine 182 of FIG. 1) using training set 302. System 300 may train multiple models using multiple sets of features of the training set 302 (e.g., a first set of features including a group of sensors of the training set 302, a second set of features including a different group of sensors of the training set 302, etc.). For example, system 300 may train a machine learning model to generate a first trained machine learning model using the first set of features in the training set and to generate a second trained machine learning model using the second set of features in the training set (e.g., different data than the data used to train the first machine learning model). In some embodiments, the first trained machine learning model and the second trained machine learning model may be combined to generate a third trained machine learning model (e.g., which may be a better predictor than the first or the second trained machine learning model on its own). In some embodiments, sets of features used in comparing models may overlap (e.g., one model may be trained with simulated sensors 1-15, and a second model trained with simulated sensors 10-20). In some embodiments, hundreds of models may be generated including models with various permutations of features and combinations of models.

At block 314, system 300 performs model validation (e.g., via validation engine 184 of FIG. 1) using the validation set 304. System 300 may validate each of the trained models using a corresponding set of features of the validation set 304. For instance, validation set 304 may use the same subset of sensors used in training set 302, but for different maintenance events. In some embodiments, system 300 may validate hundreds of models (e.g., models with various permutations of features, combinations of models, etc.) generated at block 312. At block 314, system 300 may determine an accuracy of each of the one or more trained models (e.g., via model validation) and may determine whether one or more of the trained models has an accuracy that meets a threshold accuracy. Responsive to determining that none of the trained models has an accuracy that meets a threshold accuracy, flow returns to block 312 where system 300 performs model training using different sets of features of the training set. Responsive to determining that one or more of the trained models has an accuracy that meets a threshold accuracy, flow continues to block 316. The system 300 may discard the trained models that have an accuracy that is below the threshold accuracy (e.g., based on the validation set).

At block 316, system 300 performs model selection (e.g., via selection engine 185 of FIG. 1) to determine which of the one or more trained models that meet the threshold accuracy has the highest accuracy (e.g., the selected model 308, based on the validating of block 314). Responsive to determining that two or more of the trained models that meet the threshold accuracy have the same accuracy, flow may return to block 312 where the system 300 performs model training using further refined training sets corresponding to further refined sets of features for determining a trained model that has the highest accuracy.

At block 318 system 300 performs model testing (e.g., via testing engine 186 of FIG. 1) using the testing set 306 to test the selected model 308. The system 300 may test, using the first set of features in the testing set (e.g., simulated sensors 1-15), the first trained model to determine the first trained model meets a threshold accuracy (e.g., based on the first set of features of the testing set 306). Responsive to accuracy of the selected model 308 not meeting the threshold accuracy (e.g., the selected model 308 is overly fit to the training set 302 and/or validation set 304 and is not applicable to other data sets such as the testing set 306), flow continues to block 312 where the system 30A performs model training (e.g., retraining) using different training sets possibly corresponding to different sets of features or a reorganization of substrates split into training, validation, and testing sets. Responsive to determining that the selected model 308 has an accuracy that meets a threshold accuracy based on the testing set 306, flow continues to block 320. In at least block 312, the model may learn patterns in the sensor data to make predictions and in block 318, the system 300 may apply the model on the remaining data (e.g., testing set 306) to test the predictions.

At block 320, system 300 uses the trained model (e.g., selected model 308) to receive current sensor data 346 (e.g., current sensor data 146 of FIG. 1) and determines (e.g., extracts), from the output of the trained model, predictive data 366 (e.g., predictive data 168 of FIG. 1) to perform an action (e.g., perform a corrective action in association with manufacturing equipment 124 of FIG., provide and alert to user device 120 of FIG. 1, etc.).

In some embodiments, retraining of the machine learning model occurs by supplying additional data to further train the model. Current sensor data 352 may be provided at block 312. Additional verification data 361 may be provided as well. These data may be different from the data originally used to train the model by incorporating combinations of input parameters not part of the original training, input parameters outside the parameter space spanned by the original training, or may be updated to reflect chamber specific knowledge (e.g., differences from an ideal chamber due to manufacturing tolerance ranges, aging components, etc.). Selected model 308 may be retrained based on this data.

In some embodiments, one or more of the acts 310-320 may occur in various orders and/or with other acts not presented and described herein. In some embodiments, one or more of acts 310-320 may not be performed. For example, in some embodiments, one or more of data partitioning of block 310, model validation of block 314, model selection of block 316, or model testing of block 318 may not be performed.

FIGS. 4A-F are flow diagrams of methods 400A-F associated with generating predictive data and/or verification data to cause a corrective action and/or to determine whether a maintenance stage or operation of a maintenance process was performed successfully, according to some embodiments. Methods 400A-F may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiment, methods 400A-F may be performed, in part, by predictive system 110 of FIG. 1. Method 400A may be performed, in part, by predictive system 110 (e.g., server machine 170 and data set generator 172 of FIG. 1, data set generator 272 of FIG. 2). Predictive system 110 may use method 400A to generate a data set to at least one of train, validate, or test a model, for example a physics-based model and/or machine learning model, in accordance with embodiments of the disclosure. Method 400B may be performed by server machine 180 (e.g., training engine 182, etc.). Method 400C may be performed by predictive server 112 (e.g., predictive component 116). Method 400D may be performed by user device 120. Method 400E may be performed by predictive system 110 (e.g., server machine 180). Method 400F may be performed by predictive system 110 (e.g., predictive server 112). In some embodiments, a non-transitory storage medium stores instructions that when executed by a processing device (e.g., of predictive system 110, of server machine 180, of predictive server 112, of user device 120, etc.) cause the processing device to perform one or more of methods 400A-F.

For simplicity of explanation, methods 400A-F are depicted and described as a series of operations. However, operations in accordance with this disclosure can occur in various orders and/or concurrently and with other operations not presented and described herein. Furthermore, not all illustrated operations may be performed to implement methods 400A-F in accordance with the disclosed subject matter. In addition, those skilled in the art will understand and appreciate that methods 400A-F could alternatively be represented as a series of interrelated states via a state diagram or events.

Figures 4A, 4B:
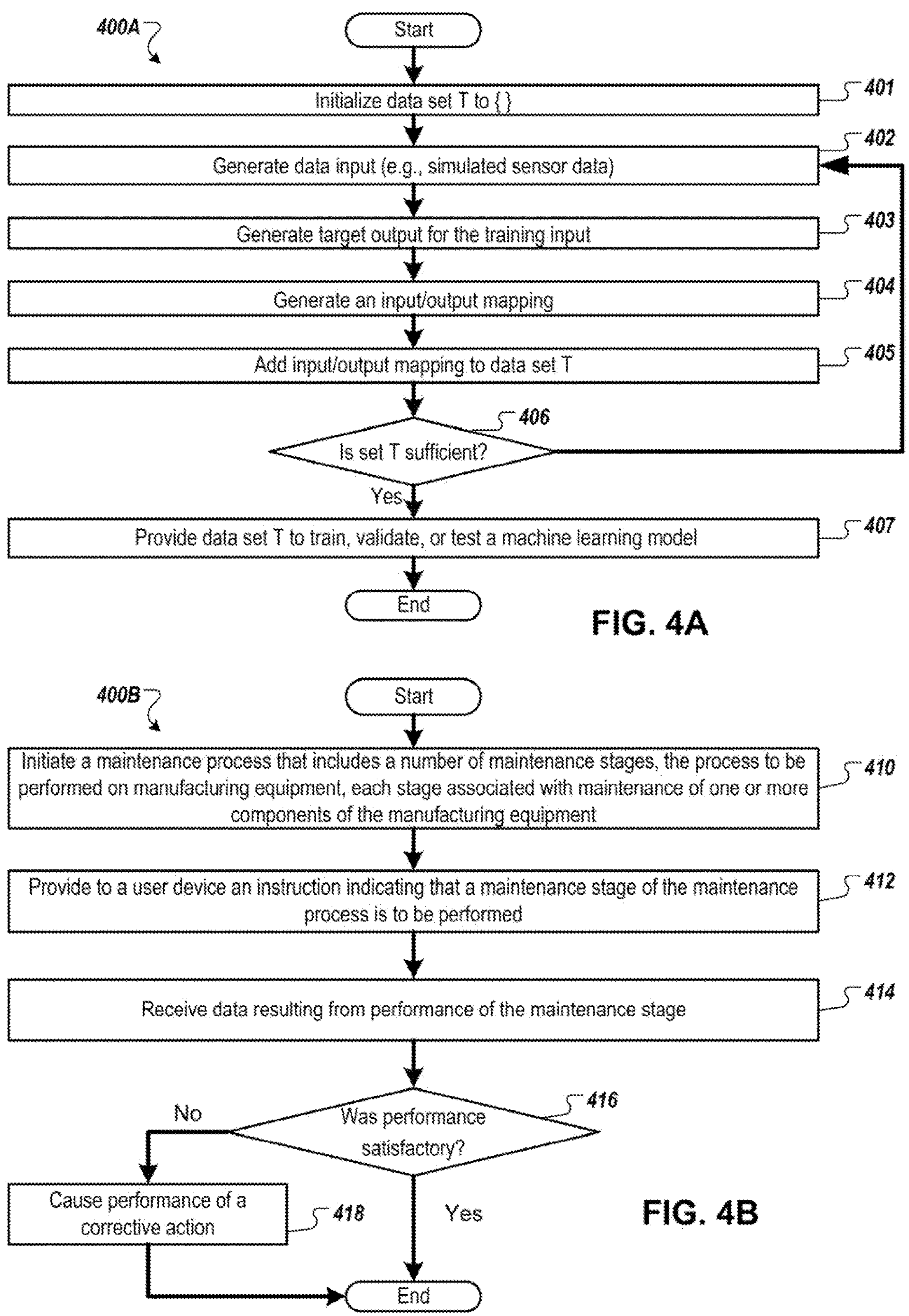
FIGS. 4A-F are flow diagrams of methods associated with generating predictive data to cause a corrective action, according to some embodiments.

FIG. 4A is a flow diagram of a method 400A for generating a data set for a model for generating predictive data (e.g., predictive data 168 of FIG. 1), according to certain embodiments.

Referring to FIG. 4A, in some embodiments, at block 401 processing logic implementing method 400A initializes a training set T to an empty set.

At block 402, processing logic generates first data input (e.g., first training input, first validating input) that may include sensor data (e.g., sensor data 262 of FIG. 2), etc. In some embodiments, the first data input may include a first set of features for types of data and a second data input may include a second set of features for types of data (e.g., as described with respect to FIG. 3).

At block 403, processing logic generates a first target output for one or more of the data inputs (e.g., first data input). In some embodiments, the first target output is an indication of verification of a maintenance stage, associated with input sensor data. In some embodiments, the target output may be associated with predicted performance of products to be produced using manufacturing equipment associated with input sensor data.

At block 404, processing logic may generate mapping data that is indicative of an input/output mapping. The input/output mapping (or mapping data) may refer to the data input (e.g., one or more of the data inputs described herein), the target output for the data input, and an association between the data input(s) and the target output.

At block 405, processing logic adds the mapping data generated at block 404 to data set T, in some embodiments.

At block 406, processing logic branches based on whether data set T is sufficient for at least one of training, validating, and/or testing model 190 of FIG. 1. If sufficient, execution proceeds to block 407, otherwise, execution continues back at block 402. It should be noted that in some embodiments, the sufficiency of data set T may be determined based simply on the number of inputs, mapped in some embodiments to outputs, in the data set, while in some other implementations, the sufficiency of data set T may be determined based on one or more other criteria (e.g., a measure of diversity of the data examples, accuracy, etc.) in addition to, or instead of, the number of inputs.

At block 407, processing logic provides data set T (e.g., to server machine 180 of FIG. 1) to train, validate, and/or test model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. The data set generated by method 400A may then be used to take as input data from sensors indicative of performance of a maintenance stage, and produce as output data indicative of the results of the performance of the maintenance stage (e.g., quality of the maintenance, quality of products to be produced, etc.).

FIG. 4B is a method 400B for a server to facilitate satisfactory performance of a maintenance process, according to some embodiments.

Referring to FIG. 4B, at block 410 of method 400B, processing logic of the server initiates a maintenance process. The maintenance process is to be performed on manufacturing equipment. The maintenance process includes a number of maintenance stages or operations. The maintenance stages/operations are associated with one or more components of the manufacturing equipment. In some embodiments, initiating the maintenance process includes sending data to a user device, indicating that the user device instruct a user to begin the maintenance process or maintenance stage. In some embodiments, initiating the maintenance process includes sending instructions to manufacturing equipment, updating parameters for the maintenance process. In some embodiments, the server initiates the maintenance event in response to a trigger, such as a certain number of hours the manufacturing equipment has been in production, a certain number of products produced, etc. In some embodiments, the server initiates the maintenance event in response to an alert from a user device.

At block 412, processing logic of the server provides, to a user device, an instruction indicating that a maintenance stage of the maintenance process is to be performed. In some embodiments, the server may also provide instructions associated with the maintenance stage to be output from the user device to a user. The instructions may include information pertaining to performance of the maintenance stage, such as step-by-step maintenance instructions, pictures, video, audio, etc. In some embodiments, some or all maintenance stages may be performed without the input of a user (e.g., flushing the chamber with a gas, controlling heating elements, etc.). In some embodiments, during stages of a maintenance process that are not performed with the input of a user, instructions may instead be provided by the server directly to manufacturing equipment. In some embodiments, providing instructions may include providing settings to connected instruments, e.g., setting the torque on a smart wrench.

At block 414, processing logic of the server receives data resulting from performance of the maintenance stage. In some embodiments, the data received includes sensor data from sensors associated with the manufacturing equipment. In some embodiments, the data received is provided by a user via the user device. In some embodiments, the data received includes image or video data provided by the user device. For example, the user device may include a camera. The user main point the camera of the user device at one or more regions of the manufacturing equipment and generate images and/or video of the regions. In some embodiments, the user device provides instructions to the user on which regions to image. In some embodiments, the data received includes data provided by connected instruments (e.g., a connected smart torque wrench providing a measure of torque achieved by the tool, etc.). In some embodiments, the server sends instructions to the connected instruments that causes them to perform a maintenance operation according to specified parameters. For example, the server may send instructions indicating a maximum torque to apply, and the torque wrench may not apply a torque higher than the indicated maximum torque.

At block 416, processing logic of the server performs operations and determines whether performance of the maintenance stage was satisfactory. The specific metric, model, threshold, etc. used to make this determination varies amongst maintenance processes, maintenance events, and maintenance stages. In some embodiments, processing logic of the server may compare a data value indicative of performance of the maintenance stage to a threshold, and if (for example) the value is above the threshold, determine that the maintenance stage was not performed satisfactorily (e.g., a maintenance stage may include pumping a manufacturing chamber down to vacuum, and measurement of a pressure sensor may be compared to a threshold value to determine if the chamber achieves an adequate level of vacuum).

In some embodiments, processing logic of the server may provide data indicative of performance of the maintenance stage (possibly pre-processed by the user device, the server, etc.) to a physics-based model for verification. As an example, a physics-based digital twin model may be built describing gas flow in a manufacturing chamber. Pressure sensor data may be collected as the manufacturing chamber is vented to atmospheric pressure. Sensor data may then be compared to simulated pressure data from the physics-based model, modeling venting the manufacturing chamber in the same way (e.g., using the same valve). Differences between the measured sensor data and simulated sensor data may indicate drift, aging, or failure of components, sensor drift or failure, etc. In some embodiments, statistical data may be used (e.g., the average of a number of simulated pressure data, how many standard deviations from the average a data point of measured sensor data is, etc.). In some embodiments, the physics-based model may predict what components, failures, etc., may be contributing to a difference between simulated and measured sensor data. Many types of sensors, different maintenance operations, types of physics-based models, etc., are possible within the scope of this disclosure.

In some embodiments, processing logic of the server may provide data indicative of performance of the maintenance stage to a trained machine learning model for verification. The trained machine learning model may take as input the data indicative of performance of the maintenance stage and may produce as output a verification indicating whether or not the performance of the maintenance stage is satisfactory. As an example, a user may provide an image of a component associated with a maintenance operation, for instance using a camera of a user device (e.g., user device 120 of FIG. 1). In some embodiments, the user may be instructed (e.g., via a display of user device 120) to take an image, video, etc., of a component of the manufacturing equipment. In some embodiments, a picture of a component may be taken before and after maintenance. The image or images may be provided as input to a trained machine learning model, wherein the trained machine learning model is configured to output data indicative of the quality of performance of one or more maintenance operations associated with the pictured component (e.g., verification data).

Satisfactory performance verification may indicate that components maintained are evaluated to be likely to operate correctly after maintenance. Satisfactory performance verification may indicate that a user performed maintenance operations properly. Satisfactory performance verification may indicate that sensor data is similar to sensor data achieved during a successful maintenance process.

If performance of the maintenance stage was determined to be satisfactory, verification data indicating successful performance of the maintenance stage may be generated (not shown), and the method ends. If performance of the maintenance stage was determined to be unsatisfactory, flow proceeds to block 418. At block 418, processing logic of the server causes performance of a corrective action. In some embodiments, the corrective action may include providing an alert to a user. In some embodiments, the alert may include instructions to be displayed to a user via the user device. In some embodiments, the alert includes instructions for the user to assist in the maintenance process. In some embodiments, the instructions include instructions to repeat the maintenance stage, or a portion of the maintenance stage. In some embodiments, the instructions suggest troubleshooting operations. In some embodiments, instructions may include written maintenance instruction, pictures, video, audio, etc.

In some embodiments, the corrective action may include updating a process recipe. In some embodiments, performance of operations of the maintenance stage may be updated by the processing logic, e.g., to account for chamber drift, component aging, etc.

Figure 4C:
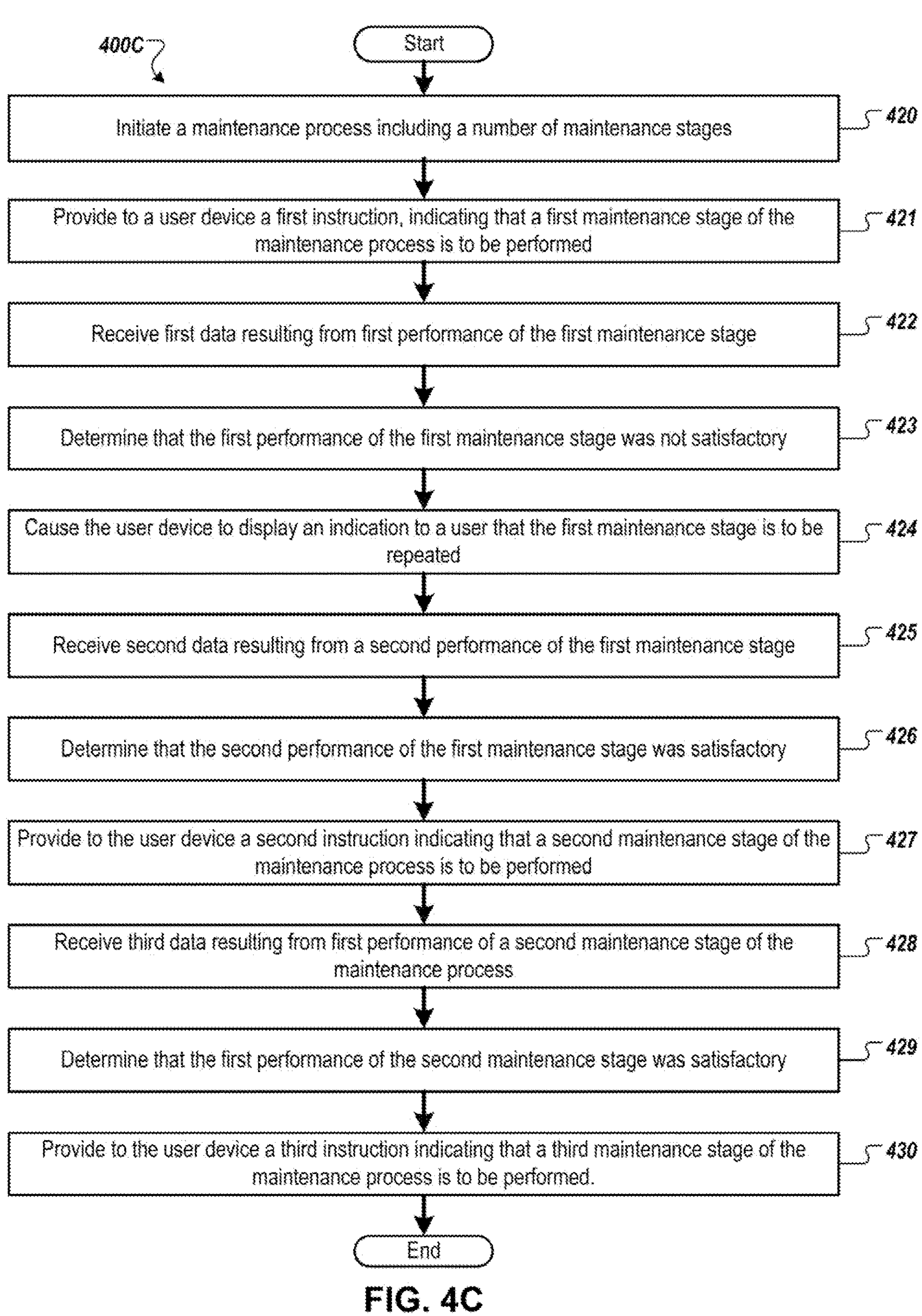

FIG. 4C depicts an extended method 400C for a server to facilitate satisfactory performance of a maintenance process, according to some embodiments. Many operations of method 400C have similar features to the operations of method 400B, e.g., blocks 410, 412, 414, and 416 of FIG. 4B may include similar features as blocks 420, 421, 422, and 423 of FIG. 4C, the maintenance stage and data resulting from the maintenance stage of FIG. 4B mapping to the first maintenance stage and first data resulting from the first maintenance stage of FIG. 4C.

At block 424, processing logic of the server causes the user device to display an indication to a user that the first maintenance stage is to be repeated. This may be a specific case of the general operation shown in FIG. 4B, causing performance of a corrective action.

At block 425, processing logic of the server receives second data resulting from a second performance of the first maintenance stage. The data may take many forms, as discussed in connection with block 414 of FIG. 4B. At block 426, processing logic of the server determines that the second performance of the first maintenance stage was satisfactory. This may be determined, for example, by comparing sensor data to a threshold value and finding that the sensor data satisfies at least one threshold criterion, or by providing sensor data (including sensors associated with manufacturing equipment, sensors associated with the user device, sensors associated with connected instruments, etc.) to a trained model (e.g., physics-based model, machine learning model, etc.) and receiving output verifying that the maintenance stage was performed satisfactorily, etc.

At block 427, processing logic of the server provides to the user device an instruction indicating that a second maintenance stage of the maintenance process is to be performed. This instruction may be provided in view of the server receiving verification data indicating that the first maintenance stage was satisfactorily performed.

At block 428, processing logic of the server receives third data resulting from first performance of the second maintenance stage of the maintenance process. This data may take many forms, and may be similar to data received at block 425. At block 429, processing logic of the server determines that the first performance of the second maintenance stage was satisfactory. At block 430, processing logic of the server provides to the user device an instruction indicating that a third maintenance stage of the maintenance process is to be performed.

It will be understood that method 400C is a representative example, and the present disclosure is not limited to this or any specific arrangement of verification operations; e.g., a first performance of a first maintenance stage may pass verification, a first performance of a second maintenance stage may fail verification, and the server may provide an indication of a corrective action, etc. Additionally, in some operations, the server may provide instruction to a different device than the user device, e.g., devices controlling manufacturing equipment, connected instruments, etc., and be within the scope of this disclosure.

Figure 4D:
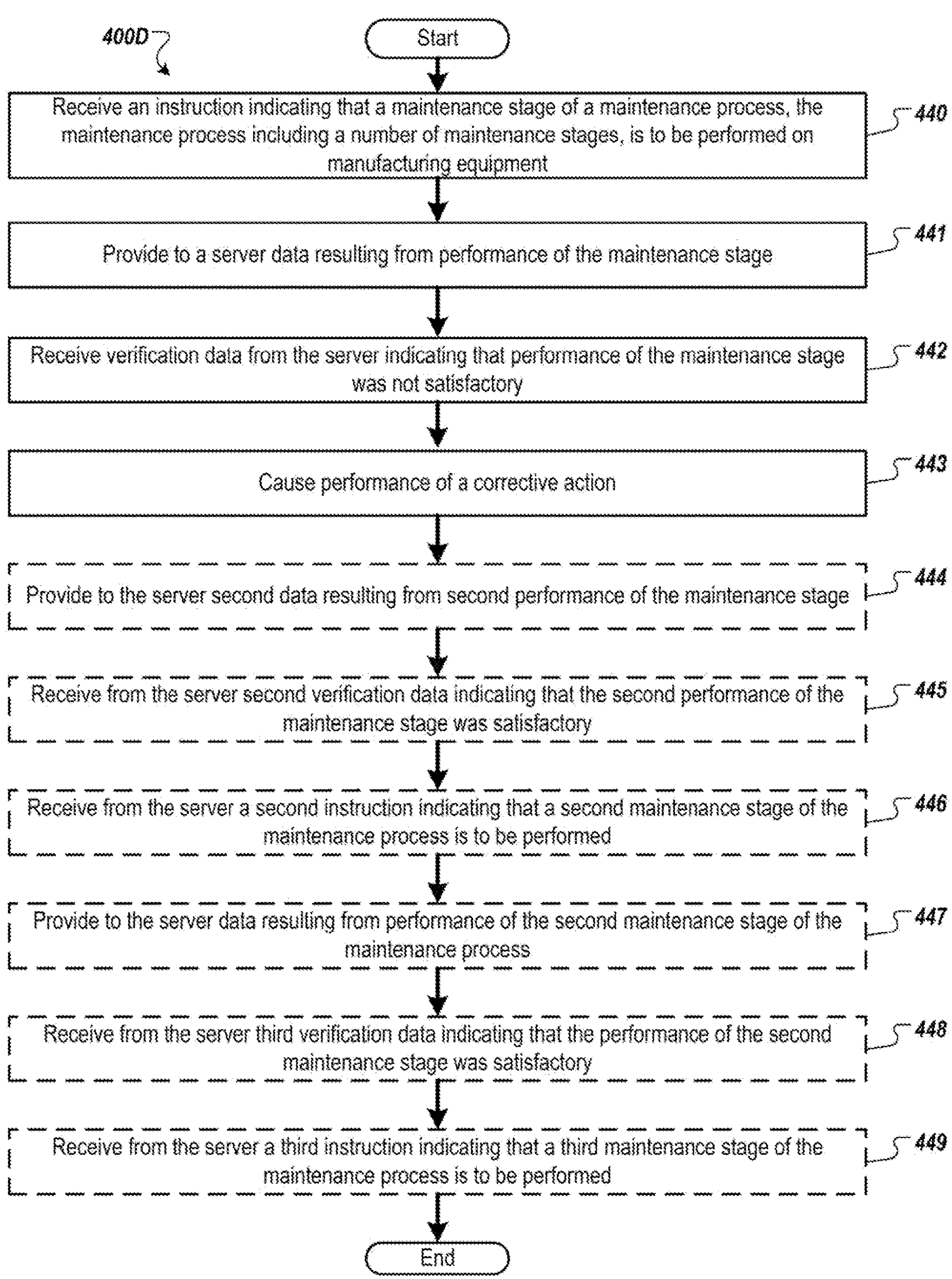

FIG. 4D is a flow diagram depicting method 400D for a user device to facilitate performance of a maintenance stage, according to some embodiments. The user device may include a smartphone, tablet, laptop, wearable computing device, etc. The user device may be a dedicated machine, a program or application running on a general use computing device, etc. The user device may be configured to communicate with manufacturing equipment and a server. The user device may communicate via a network.

At block 440, processing logic of the user device receives an instruction indicating that a maintenance stage of a maintenance process is to be performed, in association with manufacturing equipment. The instruction may be accompanied with materials to be displayed by the user device to a user. The materials may include descriptions of the maintenance stage, pictures or videos describing performance of the maintenance stage, etc.

At block 441, processing logic of the user device provides to a server data resulting from performance of the maintenance stage. In some embodiments, the data may be indicative of sensor readings of sensors associated with the manufacturing equipment. In some embodiments, the data may be image or video data, or other data provided by the user, such as a confirmation of performance of the maintenance stage, a written description of performance of the maintenance stage, etc. In some embodiments, the data may be indicative of readings from sensors of connected instruments. In some embodiments, some of these data may be provided to the server via the network without being processed by the user device.

At block 442, processing logic of the user device receives verification data from the server indicating that performance of the maintenance stage was not satisfactory. The verification data may be in the form of a pass/fail, a grade or rating, or the like. At block 443, the user device causes the performance of a corrective action in view of the verification data. In some embodiments, the corrective action includes providing an alert to a user. In some embodiments, the alert includes an indication of further maintenance tasks to be performed. In some embodiments, the corrective action includes updating a maintenance process recipe, such as adjusting a temperature, pressure, flow, etc., associated with the manufacturing equipment or a setting associated with a connected instrument.

Operations of blocks 444-449 may be performed if data processing indicates that a maintenance stage is to be repeated, indicated by the dashed boxes. At block 444, processing logic of the user device provides to the server second data resulting from second performance of the first maintenance stage. The data may be of the same type/in the same form as first data resulting from first performance of the first maintenance stage. At block 445, processing logic of the user device receives from the server second verification data indicating that the second performance of the maintenance stage was satisfactory. The verification data may have many of the same features as the verification data of block 442.

At block 446, processing logic of the user device receives from the server a second instruction indicating that a second maintenance stage of the maintenance process is to be performed. The second stage of the maintenance process is different from the first, and may include different operations, involve different components of the manufacturing equipment, etc. At block 447, processing logic of the user device provides to the server data resulting from performance of the second maintenance stage of the maintenance process. This data may share many features with the data of block 441.

At block 448, the user device receives, from the server, verification data associated with the performance of the second maintenance stage. The verification data may indicate that performance of the second maintenance stage was satisfactory. At block 449, the user device receives instruction indicating that a third maintenance stage of the maintenance process is to be performed.

Similar to the description in connection with FIG. 4C, method 400D is one example set of operations of the present disclosure. Methods of the disclosure are not limited to the particular order of verification pass and failure, may include other operations between those shown, etc.

Figure 4E:
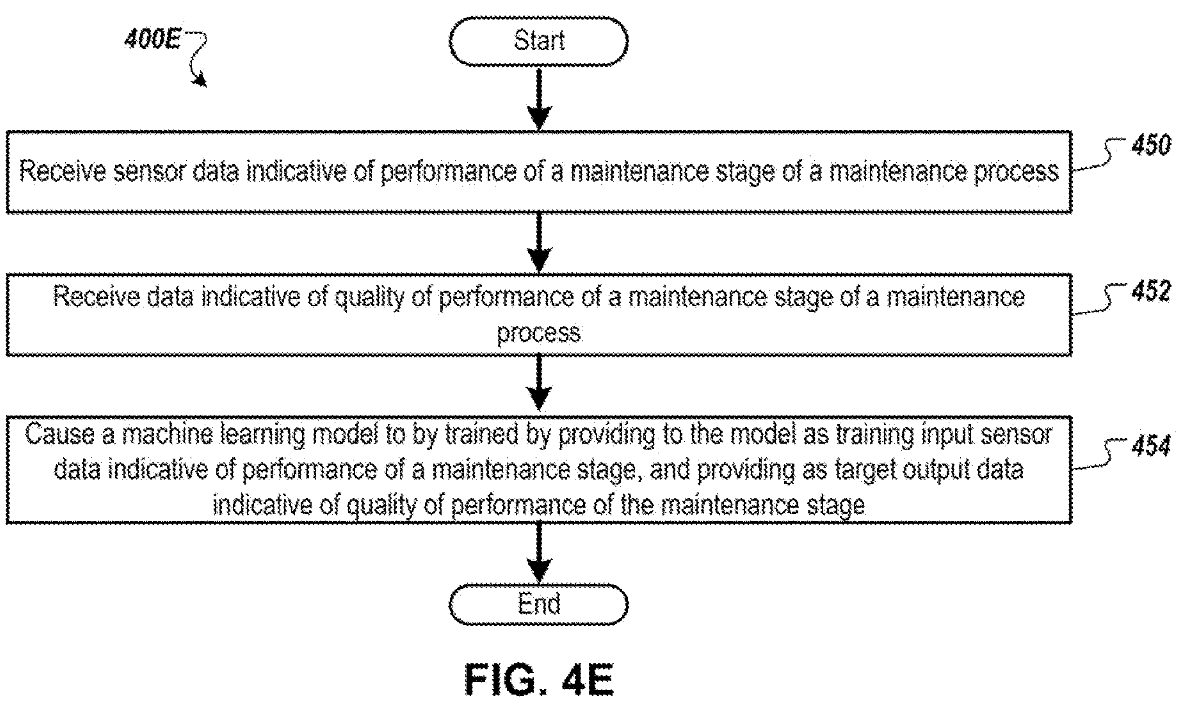
Figure 4F:
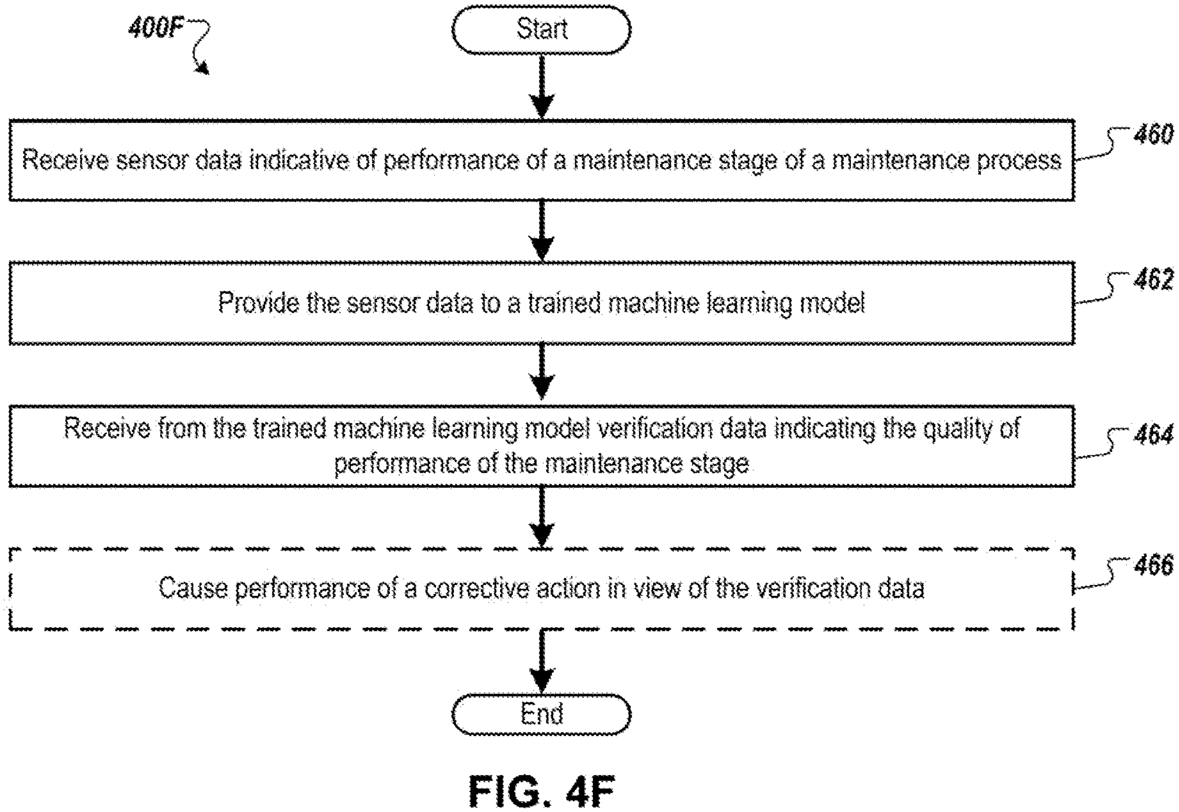

FIGS. 4E-F are flow diagrams depicting methods 400E and 400F related to machine learning models, according to some embodiments. Some operations of methods 400E and 400F may also be applicable to physics-based models, as appropriate.

FIG. 4E depicts a flow diagram of a method 400E for training a machine learning model. At block 450, processing logic receives sensor data indicative of performance of a maintenance stage of a maintenance process. The processing logic may be a part of a system for generating predictive data, e.g., predictive system 110 of FIG. 1. The data may be received as a training data set, e.g. from data set generator 172 of FIG. 1. At block 452, processing logic receives data indicative of quality of performance of the maintenance stage of the maintenance process. The data received may include data correlating data indicative of performance (e.g., sensor data) to data indicative of quality of performance (e.g., metrology of a finished product, a indication of quality such as a grade or score, etc.).

At block 454, processing logic causes training of a machine learning model. The training may include providing as training input sensor data indicative of performance of a maintenance stage. The training may further include providing as target output data indicative of quality of performance of the maintenance stage. The trained machine learning model may then be configured to accept as input data indicative of performance of a maintenance stage (e.g., sensor data from sensors associated with manufacturing equipment, sensors associated with a user device, sensors associated with connected tools, etc.). The training of the machine learning model may be performed by a training engine, e.g., training engine 182 of server 180 of FIG. 1.

FIG. 4F is a flow diagram of method 400F for using a trained machine learning model, according to some embodiments. At block 460, processing logic receives sensor data indicative of performance of a maintenance stage of a maintenance process. At block 462, processing logic provides the sensor data to a trained machine learning model. In some embodiments, some processing of the sensor data may have occurred, and data indicative of sensor data may have been received by the processing logic and/or provided by the processing logic to the trained model.

At block 464, the processing logic receives from the trained machine learning model verification data indicating the quality of performance of the maintenance stage. The verification may take the form of a pass/fail (e.g., performance of the maintenance stage was/was not satisfactory), a grade or rating, etc. In some embodiments, the processing logic may receive additional information associated with the performance of the maintenance stage. The trained machine learning model may be trained to produce additional information, e.g., based on sensor data, the model may suggest a corrective action, a particular component to be maintained, etc. Operations of block 466 may be performed if the trained machine learning model provides an indication that performance of the maintenance stage was not satisfactory, represented by the dashed box. At block 466, processing logic causes performance of a corrective action. Operations of block 466 may share many features with operations of block 418 of FIG. 3B.

Figure 5:
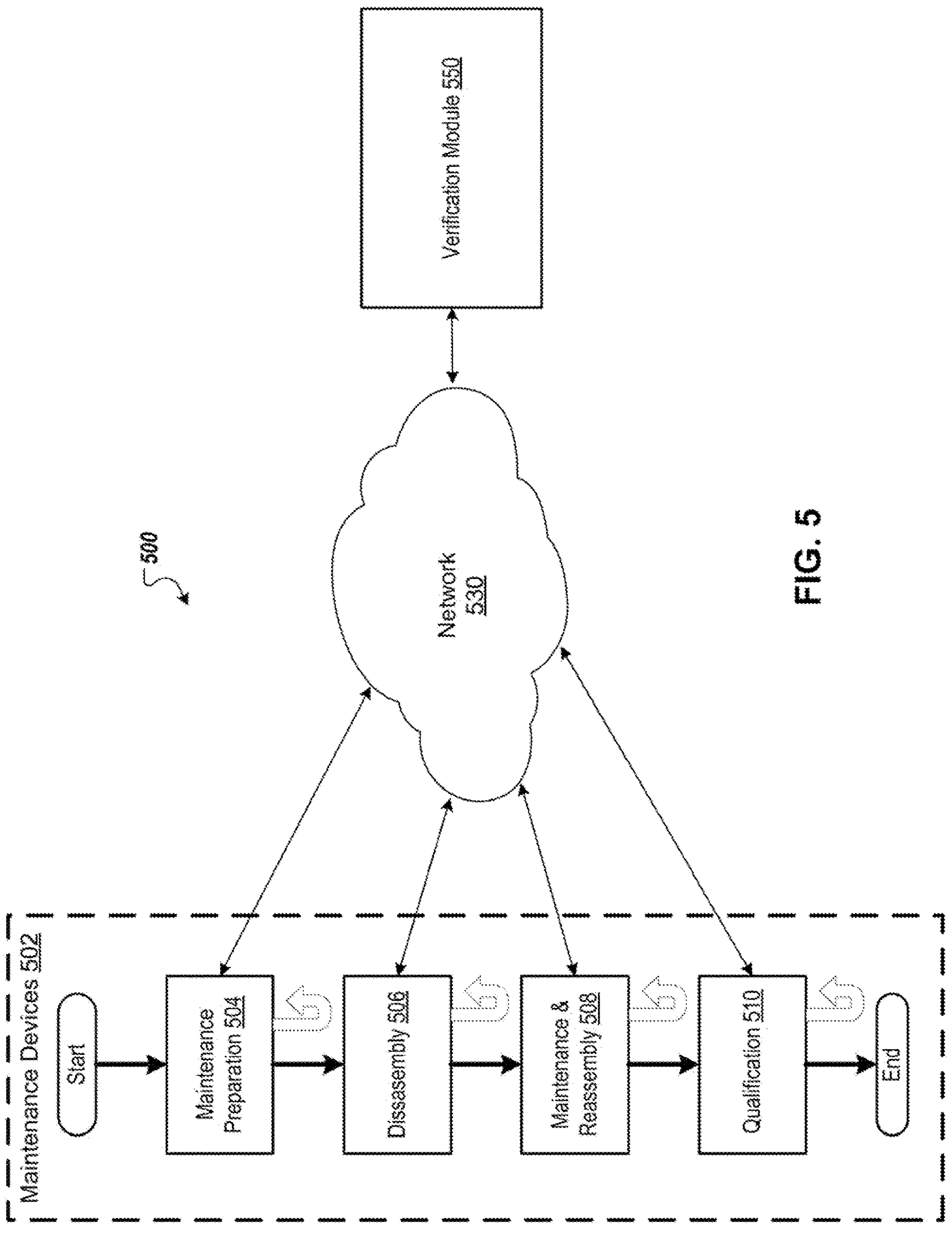
FIG. 5 is a diagram of operations of a system to improve a maintenance process, according to some embodiments.

FIG. 5 is a diagram of operations of system 500 to improve a maintenance process, according to some embodiments. System 500 includes maintenance devices 502 with various maintenance operations associated with the devices presented as a flow chart, a network 530 (e.g., network 130 of FIG. 1), and a verification module 550 (e.g., a model or models that are part of predictive system 110 of FIG. 1). Maintenance devices 502 may include manufacturing equipment, user devices, connected tools, etc. The operations shown associated with maintenance devices 502 are generalized abstractions of maintenance operations such as preventative maintenance operations, and are included to outline an example method of performing a maintenance process. Each operation shown in FIG. 5 may include many separate operations, and may not appear in this order, may be broken up and interspersed with operations of other blocks, etc.

In some embodiments, a maintenance process begins with some operations of maintenance preparation 504. These operations may be directed at preparing for disassembly of manufacturing equipment, e.g., preparing to open a manufacturing chamber to allow access to internal components. Operations of maintenance preparation 504 may include running cleaning procedures, purging the interior of a manufacturing chamber, turning off heaters and chillers, venting a chamber, etc. Data indicative of performance of these operations may be collected from sensors associated with the manufacturing equipment. The sensors may be, for example, onboard sensors such as pressure sensors, temperature sensors, flow sensors, and so on. In some embodiments, after performance of a stage of the maintenance process (e.g., after performance of some subset of the operations of the maintenance process), data indicative of performance of the stage is provided via network 530 to verification module 550. Verification module 550 may determine a quality of performance of the maintenance stage. The quality of performance may be determined by comparing data indicative of performance of the maintenance stage to a threshold or thresholds, providing data indicative of performance of the maintenance stage to a physics-based model and receiving an output from the physics-based model (and optionally comparing the output of the physics-based model to one or more criteria such as thresholds), providing data indicative of performance of the maintenance stage to a trained machine learning model and receiving an output from the trained machine learning model, or the like. The verification method of any maintenance stage may be chosen and tuned to provide reliable prediction of the success of that stage. If verification indicates that the stage was performed satisfactorily, verification module 550 may indicate via network 530 that the maintenance process may proceed to the next stage. In some embodiments, verification may occur sequentially for several stages all part of maintenance preparation 504. If verification indicates that the maintenance stage was not performed satisfactorily, verification module 550 may provide an indication of a corrective action, e.g., troubleshooting operations, an instruction to repeat the maintenance stage, etc. In one embodiment, the maintenance preparation 504 stages includes a dry clean procedure, an oxygen plasma purge procedure, a process chamber disconnection procedure (in which the process chamber is taken offline), a purge process, a lid heater deactivation procedure, and chiller and heat exchanger deactivation procedure, and a vent chamber procedure. After each of these maintenance stages, a unique test may be performed to assess whether the stage was performed successfully based on sensor data collected before and/or during the maintenance stage.

The maintenance operation may then enter a phase of disassembly 506 once all maintenance preparation stages are successfully completed. Disassembly 506 may include removing a manufacturing chamber lid, removing parts (e.g., quartz and/or SiC ring(s)), removing components (e.g., chamber liner, process kit, lift pins, single ring, etc.), removing screens (e.g., plasma screen), etc. In some embodiments, some operations may not receive verification, e.g., if there is no sensor data available, to avoid the verification process becoming too cumbersome, etc. If any processes of disassembly 506 are to be verified, data indicative of performance of those stages may be provided to verification module 550 via network 530 and verification data provided by verification module 550 via network 530 as described in connection with maintenance preparation 504.

The maintenance process may then enter a phase of maintenance 508. Maintenance 508 may include cleaning components (e.g., cleaning an electrostatic chuck), removal and/or disassembly of components (e.g., a flow valve), replacing and/or installing components (e.g., installing a manometer tree, installing an insulating ring, installing LED windows, installing a viewport, installing a slit valve door, etc.), assembling or reassembling parts or components (e.g., assembling a lid and/or a lid assembly, etc. Operations of this phase may provide data for verification from connected instruments, e.g., smart tools equipped with sensors to measure properties associated with their use, e.g., torque. Maintenance stages included in reassembly and qualification 510 may also provide data from the user device and receive verification data via network 530 as described above.

In some embodiments, a user may provide information for verification of operations of maintenance 508. A user may provide via a user device image or video data indicative of performance of a maintenance stage. For example, a user may generate pictures via a user device and provide the pictures (e.g., of an electrostatic chuck assembly before and/or after a cleaning procedure) to verification module 550 via network 530. Verification module 550 may provide the images to a trained machine learning model, which is configured to output an indication of quality of performance of the maintenance stage. Verification data based on the indication of quality of performance may then be provided by verification module 550 via network 530 as described above. For some maintenance stages (e.g., cleaning stages), image data is generated and used to assess whether the maintenance stage was performed successfully. For example, a trained machine learning model may identify whether or not a chamber or part is clean after a cleaning operation. For other maintenance stages, sensor data from connected instruments (e.g., instrument readings from wrenches, screwdrivers, and/or other tools) is used to assess whether the maintenance stage was performed successfully. For example, instrument readings may be compared to thresholds to determine whether they are within tolerance of target instrument readings. For some maintenance stages, a combination of images and instrument readings from tools is used to assess whether the maintenance stage was performed successfully.

The maintenance process may then enter a phase of qualification 510. Operations of this phase may provide data for verification from manufacturing equipment sensors to verification module 550 and receive verification data via network 530 as described above. Multiple different stages of qualification may be performed in embodiments. In one qualification stage, a chamber is pumped down to a target pressure (e.g., to vacuum). Sensor data may include pressure readings indicating how long it takes to pump the chamber down to the target pressure and/or the pressure profile over time. In another qualification stage, chillers, heat exchangers and/or heaters are activated and heated and/or cooled to target temperature set points. Sensor data may include temperature readings (e.g., e.g., indicating how long it takes to reach a target temperature), voltage and/or current readings of heating elements, and so on. In another qualification stage, a chamber leak test may be performed. This may include pumping the process chamber down to a target pressure, and then measuring whether the pressure rises over time (e.g., indicating a leak). In another qualification stage, chamber seasoning may be performed. Chamber seasoning may include running one or more processes in the process chamber to cause a state of the chamber to change. Such seasoning processes may cause a coating to form on chamber components, for example. Once all qualification stages are performed successfully, the process chamber may be used on products.

Figure 6:
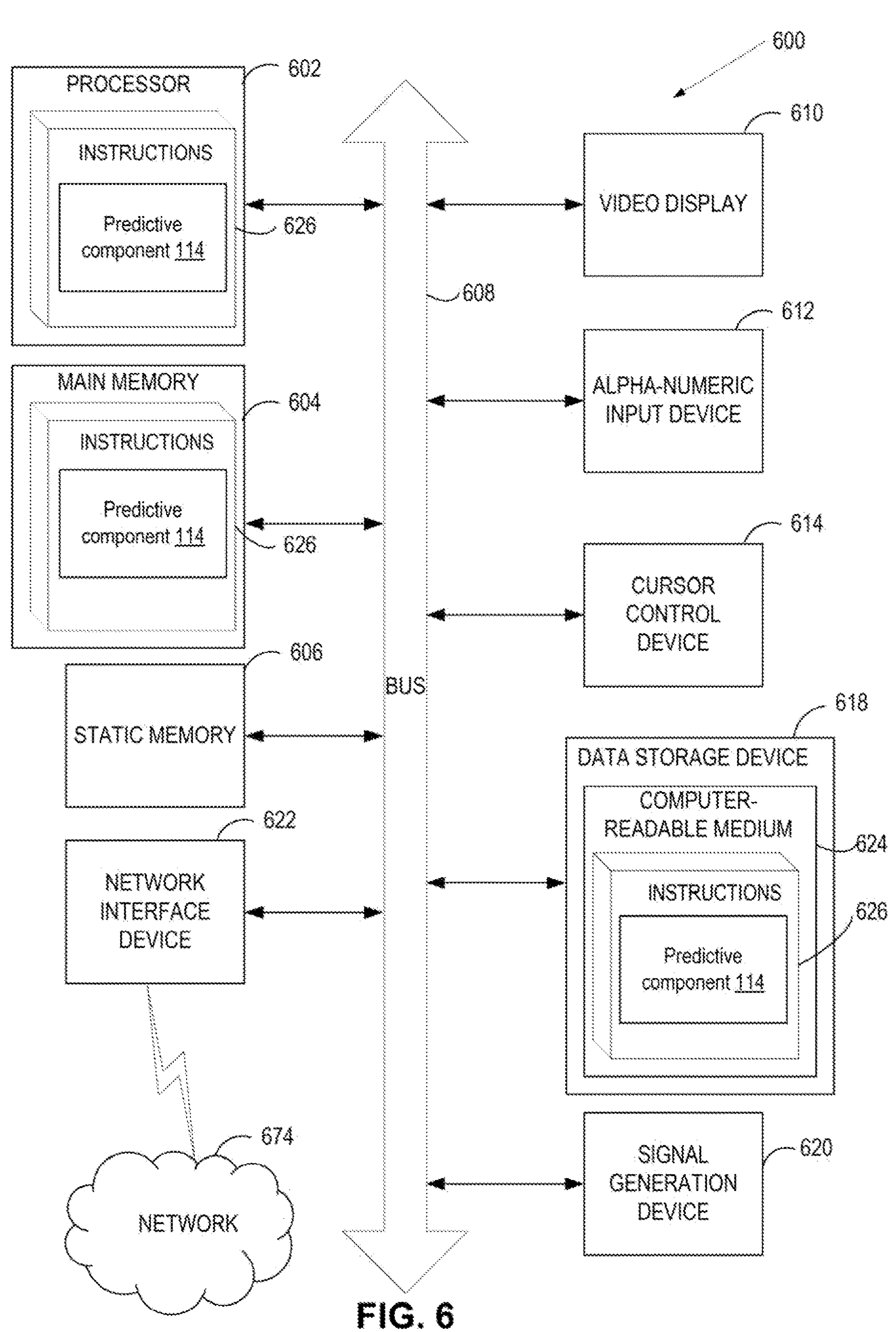
FIG. 6 is a block diagram illustrating a computer system, according to some embodiments.

FIG. 6 is a block diagram illustrating a computer system 600, according to certain embodiments. In some embodiments, computer system 600 may be connected (e.g., via a network, such as a Local Area Network (LAN), an intranet, an extranet, or the Internet) to other computer systems. Computer system 600 may operate in the capacity of a server or a client computer in a client-server environment, or as a peer computer in a peer-to-peer or distributed network environment. Computer system 600 may be provided by a personal computer (PC), a tablet PC, a Set-Top Box (STB), a Personal Digital Assistant (PDA), a cellular telephone, a web appliance, a server, a network router, switch or bridge, a wearable computing device, an augmented or virtual reality device, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 may include a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 618, which may communicate with each other via a bus 608.

Processing device 602 may be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 600 may further include a network interface device 622 (e.g., coupled to network 674). Computer system 600 also may include a video display unit 610 (e.g., an LCD), an alphanumeric input device 612 (e.g., a keyboard), a cursor control device 614 (e.g., a mouse), and a signal generation device 620.

In some implementations, data storage device 618 may include a non-transitory computer-readable storage medium 624 (e.g., non-transitory machine-readable storage medium) on which may store instructions 626 encoding any one or more of the methods or functions described herein, including instructions encoding components of FIG. 1 (e.g., predictive component 114, model 190, etc.) and for implementing methods described herein.

Instructions 626 may also reside, completely or partially, within volatile memory 604 and/or within processing device 602 during execution thereof by computer system 600, hence, volatile memory 604 and processing device 602 may also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "performing," "providing," "obtaining," "causing," "accessing," "determining," "adding," "using," "training," "initiating," "causing," "updating," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A system comprising a server and manufacturing equipment, wherein the system is configured to:

initiate a maintenance process of the manufacturing equipment, the maintenance process comprising a plurality of maintenance stages that are associated with maintenance of one or more components of the manufacturing equipment;

provide, to a user device, a first instruction indicating that a first maintenance stage of the plurality of maintenance stages is to be performed;

cause, via the first instruction, the first maintenance stage to be performed;

cause, via a second instruction, a second maintenance stage to be performed;

receive first data resulting from a first performance of the first maintenance stage, the first data comprising image or video data of the manufacturing equipment provided by the user device in connection with the first maintenance stage;

receive second data resulting from a first performance of the second maintenance stage, at least a portion of the second data provided by one or more tools communicatively connected to the system in connection with the second maintenance stage;

determine that the first performance of the first maintenance stage or the first performance of the second maintenance stage was not satisfactory based on the first data or the second data;

cause the user device to display an indication of a corrective action to be performed based on determining that the first performance of the first maintenance stage or the first performance of the second maintenance stage was not satisfactory;

cause performance of the corrective action;

responsive to obtaining an indication from the user device that the corrective action has been performed, provide a signal to activate one or more components of the manufacturing equipment to perform qualification operations in connection with the corrective action;

determine, responsive to activating the one or more components of the manufacturing equipment and based on one or more sensor measurements of processing conditions of the manufacturing equipment associated with the one or more components of the manufacturing equipment, results of the qualification operations; and responsive to determining that the results of the qualification operations satisfy one or more criteria, cause a substrate to be processed using the manufacturing equipment.

2. The system of claim 1, further comprising the user device, wherein the user device is configured to:

receive the first instruction indicating that the first maintenance stage of the plurality of maintenance stages is to be performed;

provide, to the server, the first data resulting from the first performance of the first maintenance stage;

receive, from the server, verification data indicating that the first performance of the first maintenance stage was not satisfactory; and cause performance of the corrective action in view of the verification data.

3. The system of claim 1, wherein the system is further configured to:

receive third data resulting from a second performance of the first maintenance stage;

determine that the second performance of the first maintenance stage was satisfactory; and provide, to the user device, a third instruction indicating that a third maintenance stage of the plurality of maintenance stages is to be performed.

4. The system of claim 1, wherein the system is further configured to:

receive third data resulting from a first performance of a third maintenance stage of the plurality of maintenance stages;

determine that the first performance of the third maintenance stage was satisfactory; and provide, to the user device, a third instruction indicating that a fourth maintenance stage of the plurality of maintenance stages is to be performed.

5. The system of claim 1, wherein the first data resulting from performance of the first maintenance stage further comprises:

sensor data from sensors associated with the manufacturing equipment.

6. The system of claim 1, wherein determining that the first performance of the first maintenance stage was not satisfactory comprises determining that at least one value associated with the first data does not satisfy at least one threshold criterion.

7. The system of claim 1, wherein determining that the first performance of the first maintenance stage was not satisfactory comprises:

providing data based on the first data to a physics-based model; and receiving from the physics-based model an indication that the first performance of the first maintenance stage was not satisfactory.

8. The system of claim 1, wherein determining that the first performance of the first maintenance stage was not satisfactory comprises:

providing data based on the first data to a trained machine learning model; and receiving from the trained machine learning model an indication that the first performance of the first maintenance stage was not satisfactory.

9. The system of claim 1, wherein the system is further configured to assign a score describing success of at least one of the maintenance process or a maintenance stage of the plurality of maintenance stages of the maintenance process.

10. The system of claim 9, wherein the score is indicative of a likelihood that performance of the maintenance process or the maintenance stage of the plurality of maintenance stages of the maintenance process results in the manufacturing equipment that satisfies one or more manufacturing equipment qualification criteria.

11. A method comprising:

initiating, by a server, a maintenance process of manufacturing equipment, the maintenance process comprising a plurality of maintenance stages that are associated with maintenance of one or more components of the manufacturing equipment;

providing to a user device a first instruction indicating that a first maintenance stage of the plurality of maintenance stages is to be performed;

causing, via the first instruction, the first maintenance stage to be performed;

causing, via a second instruction, a second maintenance stage to be performed;

receiving first data resulting from a first performance of the first maintenance stage, the first data comprising image or video data of the manufacturing equipment provided by the user device in connection with the first maintenance stage;

receiving second data resulting from a first performance of the second maintenance stage, the second data provided by one or more tools communicatively connected to the server in connection with the second maintenance stage;

determining that the first performance of the first maintenance stage or the first performance of the second maintenance stage was not satisfactory based on the first data or the second data;

causing performance of a corrective action;

responsive to obtaining an indication from the user device that the corrective action has been performed, providing a signal to activate one or more components of the manufacturing equipment to perform qualification operations in connection with the corrective action;

determining, responsive to activating the one or more components of the manufacturing equipment and based on one or more sensor measurements of processing conditions of the manufacturing equipment associated with the one or more components of the manufacturing equipment, results of the qualification operations; and responsive to determining that the results of the qualification operations satisfy one or more criteria, causing a substrate to be processed using the manufacturing equipment.

12. The method of claim 11, wherein the corrective action comprises at least one of: providing an alert to a user;

providing maintenance instructions to a user; or updating a process recipe.

13. The method of claim 11, further comprising:

receiving third data resulting from a second performance of the first maintenance stage;

determining that the second performance of the first maintenance stage was satisfactory; and providing to the user device a third instruction indicating that a third maintenance stage of the plurality of maintenance stages is to be performed.

14. The method of claim 11, further comprising:

receiving third data resulting from a first performance of a third maintenance stage of the plurality of maintenance stages;

determining that the first performance of the third maintenance stage was satisfactory; and providing, to the user device, a third instruction indicating that a fourth maintenance stage of the plurality of maintenance stages is to be performed.

15. The method of claim 11, wherein the first data resulting from the performance of the first maintenance stage further comprises:

sensor data from sensors associated with the manufacturing equipment.

16. A non-transitory machine-readable storage medium storing instructions which, when executed, cause a processing device to perform operations comprising:

initiating, by a server, a maintenance process of manufacturing equipment, the maintenance process comprising a plurality of maintenance stages that are associated with maintenance of one or more components of the manufacturing equipment;

providing to a user device a first instruction indicating that a first maintenance stage of the plurality of maintenance stages is to be performed;

causing, via the first instruction, the first maintenance stage to be performed;

causing, via a second instruction, a second maintenance stage to be performed;

receiving first data resulting from a first performance of the first maintenance stage, the first data comprising image or video data of the manufacturing equipment provided by the user device in connection with the first maintenance stage;

receiving second data resulting from a first performance of the second maintenance stage, the second data provided by one or more tools communicatively connected to the server in connection with the second maintenance stage;

determining that the first performance of the first maintenance stage or the first performance of the second maintenance stage was not satisfactory based on the first data or the second data;

causing performance of a corrective action;

responsive to obtaining an indication from the user device that the corrective action has been performed, providing a signal to activate one or more components of the manufacturing equipment to perform qualification operations in connection with the corrective action;

determining, responsive to activating the one or more components of the manufacturing equipment and based on one or more sensor measurements of processing conditions of the manufacturing equipment associated with the one or more components of the manufacturing equipment, results of the qualification operations; and responsive to determining that the results of the qualification operations satisfy one or more criteria, causing a substrate to be processed using the manufacturing equipment.

17. The non-transitory machine-readable storage medium of claim 16, wherein the corrective action comprises at least one of:

providing an alert to a user;

providing maintenance instructions to a user; or updating a process recipe.

18. The non-transitory machine-readable storage medium of claim 16, the operations further comprising:

receiving third data resulting from a second performance of the first maintenance stage;

determining that the second performance of the first maintenance stage was satisfactory; and providing to the user device a third instruction indicating that a third maintenance stage of the plurality of maintenance stages is to be performed.

19. The non-transitory machine-readable storage medium of claim 16, the operations further comprising:

receiving third data resulting from a first performance of a third maintenance stage of the plurality of maintenance stages;

determining that the first performance of the third maintenance stage was satisfactory; and providing, to the user device, a third instruction indicating that a fourth maintenance stage of the plurality of maintenance stages is to be performed.

20. The non-transitory machine-readable storage medium of claim 16, wherein the first data resulting from the performance of the first maintenance stage further comprises:

sensor data from sensors associated with the manufacturing equipment.

* * * * *